(12) United States Patent
Enyama et al.

(10) Patent No.: US 8,592,776 B2
(45) Date of Patent: Nov. 26, 2013

(54) CHARGED PARTICLE BEAM APPARATUS

(75) Inventors: Momoyo Enyama, Kunitachi (JP); Hiroya Ohta, Kokubunji (JP); Osamu Kamimura, Hino (JP)

(73) Assignee: Hitachi High-Technologies Corporation, Tokyo (JP)

( * ) Notice: Subject to any disclaimer, the term of this patent is extended or adjusted under 35 U.S.C. 154(b) by 647 days.

(21) Appl. No.: 12/554,577

(22) Filed: Sep. 4, 2009

(65) Prior Publication Data

US 2010/0065753 A1    Mar. 18, 2010

(30) Foreign Application Priority Data

Sep. 12, 2008    (JP) ................................. 2008-234191

(51) Int. Cl.
*H01J 3/16*    (2006.01)

(52) U.S. Cl.
USPC ....... 250/396 R; 250/306; 250/310; 250/311; 250/397; 250/396 ML

(58) Field of Classification Search
USPC ............ 250/306, 307, 309, 310, 311, 396 R, 250/397, 398, 400, 396 ML, 492.1, 492.2, 250/492.3
See application file for complete search history.

(56) References Cited

U.S. PATENT DOCUMENTS

| | | | | |
|---|---|---|---|---|
| 3,080,500 | A | * | 3/1963 | Preston ........................... 315/16 |
| 3,789,370 | A | * | 1/1974 | Bari et al. ...................... 365/128 |
| 5,319,207 | A | * | 6/1994 | Rose et al. ................. 250/396 R |
| 5,576,833 | A | | 11/1996 | Miyoshi et al. |
| 5,969,356 | A | * | 10/1999 | Grzelakowski ............... 250/310 |
| 6,784,437 | B2 | * | 8/2004 | Rose ....................... 250/396 ML |
| 6,855,939 | B2 | * | 2/2005 | Rose et al. ................. 250/396 R |
| 6,870,172 | B1 | * | 3/2005 | Mankos et al. .......... 250/492.22 |
| 7,381,949 | B2 | * | 6/2008 | Mauck .......................... 250/298 |
| 7,432,514 | B2 | * | 10/2008 | Tromp ..................... 250/492.22 |
| 7,453,062 | B2 | * | 11/2008 | Tromp .......................... 250/305 |
| 7,816,655 | B1 | * | 10/2010 | Hess et al. .................. 250/492.2 |
| 8,149,489 | B2 | * | 4/2012 | Shimokawa et al. ....... 359/199.2 |
| 2002/0117635 | A1 | | 8/2002 | Shinada et al. |
| 2003/0098415 | A1 | * | 5/2003 | Matsuya et al. .............. 250/306 |
| 2003/0111613 | A1 | | 6/2003 | Rose |
| 2004/0036031 | A1 | * | 2/2004 | Rose et al. ................. 250/396 R |
| 2004/0075053 | A1 | | 4/2004 | Preikszas et al. |
| 2005/0023486 | A1 | * | 2/2005 | Takakuwa et al. ......... 250/492.2 |
| 2006/0102848 | A1 | * | 5/2006 | Rose ....................... 250/396 ML |
| 2006/0175548 | A1 | * | 8/2006 | Kawasaki et al. ............. 250/310 |
| 2007/0200070 | A1 | * | 8/2007 | Tromp ..................... 250/396 R |
| 2008/0067376 | A1 | * | 3/2008 | Tanimoto et al. ............. 250/310 |
| 2008/0067378 | A1 | | 3/2008 | Kawasaki et al. |
| 2009/0146056 | A1 | * | 6/2009 | Zach et al. .................... 250/311 |

FOREIGN PATENT DOCUMENTS

| | | |
|---|---|---|
| JP | 5-205687 A | 8/1993 |
| JP | 7-249393 A | 9/1995 |
| JP | 11-108864 A | 4/1999 |
| JP | 2003-187731 A | 7/2003 |
| JP | 2004-519084 T | 6/2004 |
| JP | 2007-109531 A | 4/2007 |
| JP | 2007-317467 A | 12/2007 |

* cited by examiner

*Primary Examiner* — Michael Logie
(74) *Attorney, Agent, or Firm* — Miles & Stockbridge, P.C.

(57) ABSTRACT

With a multi-beam type charged particle beam apparatus, and a projection charged particle beam apparatus, in the case of off-axial aberration corrector, there is the need for preparing a multitude of multipoles, and power supply sources in numbers corresponding to the number of the multipoles need be prepared. In order to solve this problem as described, a charged particle beam apparatus is provided with at least one aberration corrector wherein the number of the multipoles required in the past is decreased by about a half by disposing an electrostatic mirror in an electron optical system.

10 Claims, 13 Drawing Sheets

CHARGED PARTICLE BEAM APPARATUS

CLAIM OF PRIORITY

The present application claims priority from Japanese patent application JP 2008-234191 filed on Sep. 12, 2008, the content of which is hereby incorporated by reference into this application.

FIELD OF THE INVENTION

The invention relates to a charged particle beam apparatus making use of a charged particle beam, such as a charged particle beam inspection apparatus, a charged particle beam measuring instrument, a charged particle beam lithography apparatus, and so forth.

BACKGROUND OF THE INVENTION

In a process of manufacturing a semiconductor, and a magnetic disc, use is made of a charged particle beam measuring instrument wherein a specimen is irradiated with a charged particle beam (hereinafter referred to as a primary beam), such as an electron beam, an ion beam, and so forth, to acquire a signal of a secondary charged particle (hereinafter referred to as a secondary beam) such as a secondary electron emitted, and so forth, thereby measuring a shape and size of a pattern formed over the specimen, and a charged particle beam inspection apparatus for checking presence of a defect, and so forth.

For such a charged particle beam apparatus as above, use has thus far been made of an apparatus in which scanning with a primary beam converged in a stream is executed over a specimen, the so-called SEM apparatus. The SEM apparatus, however, has had a problem in that much time is required for acquisition of an image since the image is acquired by two-dimensional scanning with the primary beam, so that other techniques have been under studies in order to improve a speed for processing a specimen, that is, an inspection rate.

First, a multi-beam type charged particle beam apparatus using plural beams has been proposed as a first approach. For example, in JP-A-2007-317467, there has been disclosed a multi-beam type electron beam inspection apparatus wherein an electron beam discharged from a single electron gun is divided into plural beams, and the plural beams formed by individually converging with the use of an array of lenses are applied onto a specimen for scanning with the use of a single optical element.

FIG. 1 is a schematic diagram showing an electron optical system of a multi-beam type charged particle beam apparatus that is constructed by disposing an electron source 101, a multi-beams forming unit 102, a objective lens 103, a scanning deflector 104, a specimen 105, secondary electron detectors 106a to 106c, and so forth. A primary beam 107 outgoing from the electron source 101 is turned into plural (in FIG. 1, three) primary beams after passing through the multi-beams forming unit 102, and the plural primary beams are individually focused to thereby form plural electron source images 108a to 108c, respectively. The plural primary beams 107 pass through the objective lens 103, thereby scaling down the plural electron source images 108a to 108c, respectively, to be projected over the specimen 105. The scanning deflector 104 causes multiple beams formed due to the plural primary beams 107 passing through the multi-beams forming unit 102 to undergo a deflection action substantially in the same direction, and substantially by the same angle only, respectively, thereby scanning the specimen 105. The plural primary beams 107 having reached the surface of the specimen 105 react mutually with material present in the vicinity of the surface of the specimen, whereupon electrons of secondary nature such as backscattered electrons, secondary electrons, Auger electrons, and so forth are emitted from the specimen to be thereby turned into plural secondary beams 109, to be detected by the secondary electron detectors 106a to 106c, respectively. Thus, with the multi-beam type charged particle beam apparatus, use of plural beams enables acquisition of information over a specimen at a speed several times as fast as that in the case of the SEM apparatus, and the further the number of the multiple beams is increased, the higher the inspection rate can be enhanced.

Now, with the multi-beam type charged particle beam apparatus, use is made of a single optical element such as, for example, the objective lens 103, so that the further the number of the multiple beams is increased, the greater is the number of beams among the primary beams 107, passing through tracks off the central axis (the optical axis) of the electron optical system, respectively, that is, the number of the beams passing through off-axial trajectories, respectively, will increase, so that effects of off-axial aberrations will become non-negligible. The off-axial trajectory refers to a track departing from a position on an object plane of the electron optical system, away from the optical axis, and reaching a position on an image face, away from the optical axis, and the off-axial aberration is an aberration caused by the charged particle beams passing through the off-axial trajectories, respectively. Since the aberration refers to magnitude of deviation causing a charged particle beam to fail to pass through an ideal position on an imaging plane, the charged particle beam, if affected by the off-axial aberration, cannot be focused in a stream over a specimen, coming to have a spread, so that resolution deterioration will result. The further away an off-axial distance from the optical axis, the greater is the effect of the off-axial aberration, so that it is necessary to compensate for the off-axial aberration in order to get around the trade-off between the inspection rate, and the resolution.

Further, as another approach, there has been proposed a projection charged particle beam apparatus wherein a primary beam is applied to a wide area of a specimen without being converged in a stream over the specimen, and secondary beam signals are projected on a detector with the use of an electron lens. With a projection inspection apparatus, images in block can be acquired without execution of scanning with the primary beams, so that it is possible to conduct inspection at a high rate. For example, in JP-A-Hei07 (1995)-249393, there has been disclosed a projection inspection apparatus wherein image formation is effected from backscattered electrons, and secondary electrons with the use of an electron lens, and in JP-A-Hei11 (1999)-108864, there has been disclosed a projection inspection apparatus for detecting electrons pulled back by a reversed electric field directly above the specimen before collision with a specimen, that is, mirror electrons. With the projection apparatus, it is necessary to widen an area of a specimen to be irradiated at a time in order to improve an inspection rate. The wider the area is, the greater is the number of the beams passing through the off-axial trajectories, so that the off-axial aberrations will pose a problem even with the projection apparatus.

Thus, either with the multi-beam type charged particle beam apparatus, or with the projection charged particle beam apparatus, there is the need for using the beams passing through the off-axial trajectories, away from the center of the electron optical system, respectively, so that it is necessary to compensate for the off-axial aberration in order to get around the trade-off between the inspection rate, and the resolution.

In the respective fields of a transmission electron microscope and a scanning electron microscope, an aberration corrector has become operational, and image observation higher in resolution has since come close to practical use by correction of axial chromatic aberration and spherical aberration. For example, in JP-A-Hei05 (1993)-205687, and JP-T-2004-519084, there has been disclosed an aberration correction means for correcting aberration by taking advantage of a feature of an electrostatic mirror in that aperture aberration as well as chromatic aberration thereof becomes negative.

Furthermore, there has also been proposed an aberration corrector for correcting not only axial aberration such as the aperture aberration, the axial chromatic aberration, and so forth, but also the off-axial aberration. For example, in JP-A-2003-187731, there has been disclosed off-axial aberration correction means wherein octupole components are overlapped on an electron optical system comprised of 2 systems of 7-piece set of quadrupole parts with symmetry maintained. Further, in JP-A-2007-109531, there has been proposed a charged particle beam apparatus provided with the off-axial aberration correction means as proposed in JP-A-2003-187731.

SUMMARY OF THE INVENTION

As described above, either with the multi-beam type charged particle beam apparatus, or with the projection charged particle beam apparatus, it is essential to correct the off-axial aberration in order to get around the trade-off between the inspection rate, and the resolution. However, as in described in JP-A-2003-187731, with the off-axial aberration correction means thus far proposed, there is the need for preparing a multitude of multipoles. For example, in the case of dodecapoles, there is the need for 12 units of power supply sources that are very high in voltage or current accuracy, and stability, for every electron optical element, and there is the need for preparing the power supply sources in numbers corresponding to the number of the multipoles. Furthermore, unless misalignment of the multipoles, and design error are controlled to a minimum, and symmetry of the multipoles is sufficiently maintained, aberration correction cannot be implemented, so that the proposed means have a problem in that as it is extremely difficult to adjust a voltage or current at the respective power supply sources, the means lack in practicality.

In order to solve the problem described as above, for example, with a multi-beam type charged particle beam apparatus according to one embodiment of the invention, there are provided aberration correction means wherein the number of the multipoles required in the past is decreased by about a half by disposing an electrostatic mirror in an electron optical system. Further, the aberration correction means are advantageous in that a multipole field maintaining symmetry can be automatically created, thereby rendering adjustment easier.

Now, typical charged particle beam apparatuses according to the invention are described hereunder.

According to one aspect of the invention, there is provided a charged particle beam apparatus comprising a charged particle source, a stage for supporting a specimen, an electrostatic mirror disposed in a path of charged particles emitted from the charged particle source between the charged particle source and the stage, and an aberration corrector disposed in a section of the path of the charged particles between the charged particle source and the electrostatic mirror, and a section of the path of the charged particles between the electrostatic mirror and the stage, for use in common with both sections of the path.

According to another aspect of the invention, there is provided a charged particle beam apparatus comprising a charged particle source, a stage for supporting a specimen, a charged particle optical system wherein primary charged particles emitted from the charged particle source are directed toward a surface of the specimen, a detector for detecting one of secondary charged particles generated due to the primary charged particles colliding against the surface of the specimen and mirror charged particles occurring due to the primary charged particles being pulled back without colliding against the surface of the specimen, an electrostatic mirror disposed in a path of the one of the secondary charged particles and the mirror charged particles, before the detector, and an aberration corrector disposed in a section of said path between the stage and the electrostatic mirror, and a section of said path between the electrostatic mirror and the detector, for use in common with both sections of the path.

According to still another aspect of the invention, there is provided a charged particle beam apparatus comprising a charged particle source, a stage for supporting a specimen, a charged particle optical system wherein charged particles emitted from the charged particle source are directed toward a surface of the specimen, and an electrostatic mirror disposed in a path of the charged particles emitted from the charged particle source, the electrostatic mirror comprising a plurality of reflective electrodes divided in the shape of concentric circles, wherein the charged particles are reflected by the electrostatic mirror.

With the present invention, it is possible to implement a charged particle beam apparatus capable of rendering high defect-detection sensitivity compatible with a high inspection rate. Further, with the present invention, it is possible to implement a charged particle beam apparatus that is adjustable with ease.

DETAILED DESCRIPTION OF THE PREFERRED EMBODIMENTS

Figure 1:
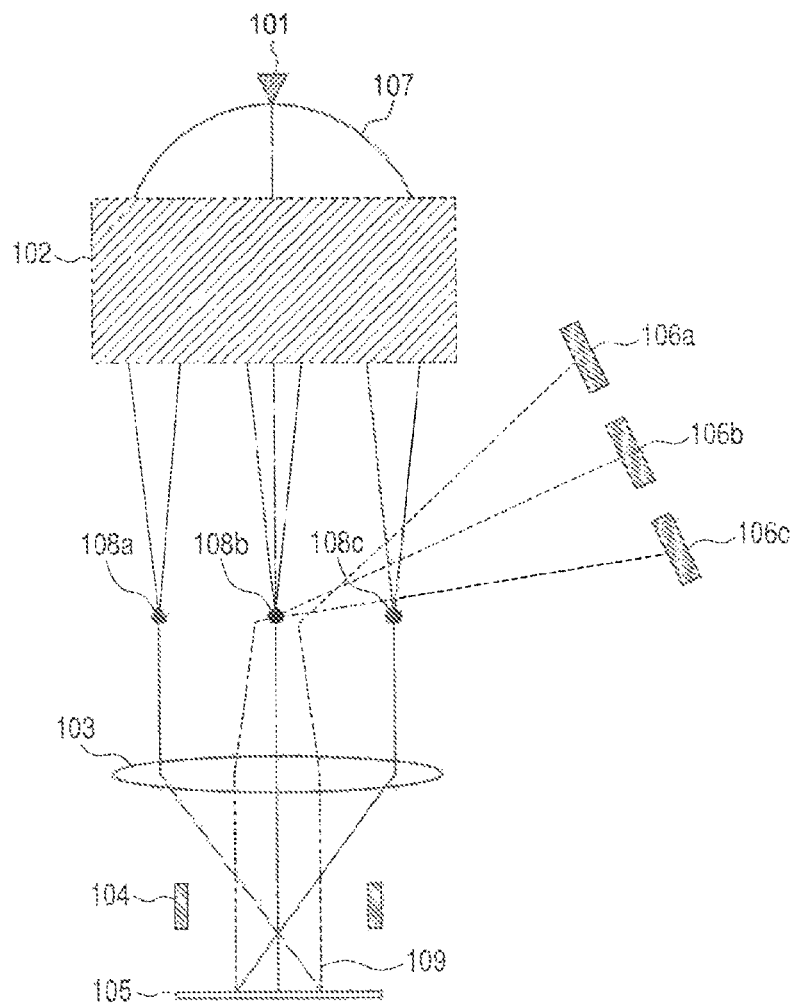
FIG. 1 is a schematic diagram of a multi-beam type charged particle beam apparatus.

Embodiments of the invention are described in detail hereinafter with reference to the accompanying drawings. In all the drawings for describing the embodiments, respectively, identical elements are denoted by like reference numerals, thereby omitting repeated description thereof. Embodiments of an inspection apparatus using an electron beam are shown hereinafter, however, it is to be pointed out that the effects of the present invention are ensured even in the case of the inspection apparatus using an ion beam, and in the case of a measuring instrument, or a common electron microscope. Further, with the respective embodiments, there is shown an example where an electron beam is used, however, the present invention is applicable to not only the case where the electron beam is used but also to the case where a charged particle beam is used. In the latter case, the designations of respective constituent elements may be considered by substituting "charged particle beam" for "electron".

First Embodiment

Figure 2:
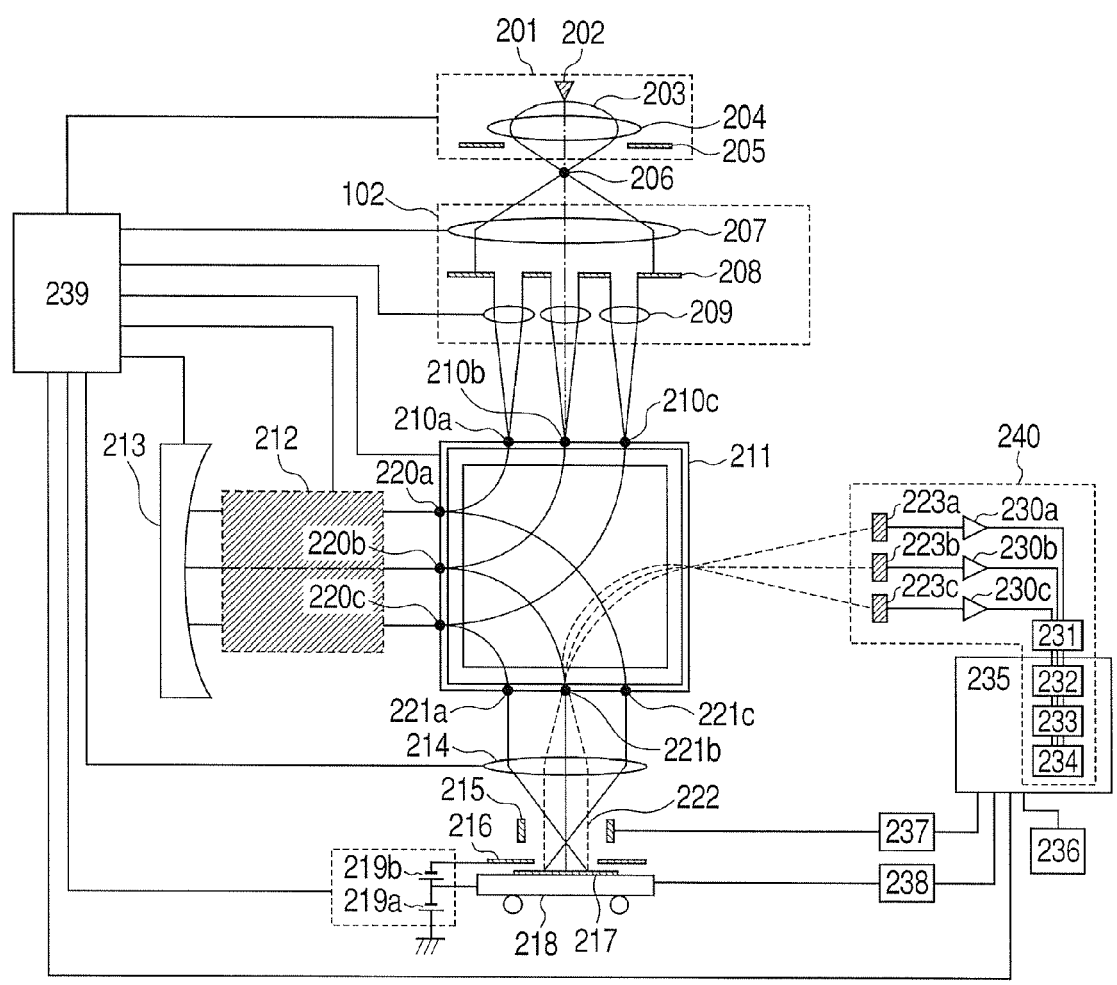
FIG. 2 is a view showing a schematic configuration of a multi-beam type electron beam inspection apparatus according to a first embodiment of the invention.

FIG. 2 is a view showing a schematic configuration of a multi-beam type electron beam inspection apparatus according to the first embodiment of the invention.

First, a makeup of the apparatus is described hereinafter. An electron gun 201 is comprised of a cathode 202 made of material low in work function, an anode 205 higher in potential than the cathode 202, and an electromagnetic lens 204 for superimposing a magnetic field on an accelerating electric field formed between the cathode and the anode. With the present embodiment, use is made of a Schottky type anode capable of easily obtaining large current, and stable in electron emission. A multi-beams forming unit 102, and a beam separator 211 are disposed in a direction downstream from the electron gun 201, in which a primary beam 203 is pulled out of the electron gun 201. Herein, with the present embodiment, the multi-beams forming unit 102 is comprised of a collimator lens 207, an aperture array 208 wherein plural apertures are arranged on the same substrate, and a lens array 209 having the plural apertures. In FIG. 2, an aberration corrector 212, and an electrostatic mirror 213 are disposed on the left-hand side of the beam separator 211, a objective lens 214, a deflector 215 for scanning deflection, and a stage 218 are disposed under the beam separator 211, and secondary electron detectors 223a to 223c, and so forth are disposed on the right side of the beam separator 211. Furthermore, an aperture for current limiting, an aligner for adjustment of the central axis (the optical axis) of the primary beam, and so forth are also added to the electron optical system although not shown in the figure. A wafer 217 is placed on the stage 218 to be thereby shifted.

A negative potential (hereinafter referred to as a retarding potential) is impressed to the wafer 217 as described later on. A wafer holder (not shown) in such a state as to be electrically continuous with the wafer is interjacent between the wafer 217, and the stage 218, and a retarding power source 219a is connected to the wafer holder to thereby impress a desired voltage to the wafer holder, and the wafer 217, respectively.

A surface electric field control electrode 216 is installed on a side of the wafer 217, facing the electron gun. A scanning signal generator 237 is connected to the deflector 215 for scanning deflection, and a surface electric field control power source 219b is connected to the surface electric field control electrode 216. An optical system controller 239 is connected the respective elements of the system, namely, the electron gun 201, the collimator lens 207, the lens array 209, the beam separator 211, the aberration corrector 212, the electrostatic mirror 213, the objective lens 214, the retarding power source 219a, and the surface electric field control power source 219b. Further, a system controller 235 is connected to the optical system controller 239. A stage controller 238 is connected to the stage 218, and further, the secondary electron detectors 223a to 223c, and the deflector 215 for scanning deflection are similarly connected to the system controller 235. A memory 232, a processor 233, and a defect determiner 234 are disposed in the system controller 235, to which an image display device 236 is connected. Furthermore, it goes without saying that constituent elements (not shown) other than those in a control system, and a circuit system are disposed in a vacuum chamber so as to be operated after the vacuum chamber is evacuated. Further, needless to say, the apparatus is provided with a wafer transfer system for disposing a wafer from outside a vacuum.

Now, there is described hereinafter a method for inspection of a wafer pattern, using the electron beam inspection apparatus.

The primary beam 203 emitted from the electron source 202 is accelerated in the direction of the anode 205 while being subjected to an effect of focusing by the electromagnetic lens 204, thereby forming a first electron source image 206 (a point where a beam diameter is at the minimum). As is the case with a common electron gun, the electron gun 201 is provided with an aperture (not shown), and is made up such that an electron beam in a desired current range is caused to pass through the aperture. If current, voltage, and so forth, to be impressed to the anode 205, and the electromagnetic lens 204, respectively, are varied, this will enable current magnitude of the primary beam passing through the aperture to be adjusted to a desired magnitude. Further, the aligner for adjustment of the optical axis of the primary beam is disposed between the electron source 202, and the collimator lens 207 although not shown in the figure, so that the apparatus has such a configuration as to enable correction to be implemented in case that the central axis of the electron beam is deviated from the aperture and the electron optical system, respectively. The primary beams that the collimator lens 207 have received from the first electron source image 206 as a light source are arranged so as to be substantially parallel with each other. With the present embodiment, the collimator lens 207 is an electromagnetic lens. The aperture array 208 has the plural apertures, and the primary beam is divided into a number of beams that have passed through the respective apertures. In FIG. 2, three beams among those primary beams are shown. The primary beams as divided are individually focused by the lens array 209 to thereby form plural second electron source images 210a to 210c, respectively. The lens array 209 includes three electrodes, each thereof having plural apertures, serving as an einzel lens against the primary beams passing through the respective apertures when a voltage is applied to the central electrode among those electrodes. In this connection, the assignee of the present invention has previously proposed "charged particle beam apparatus" as the multi-beam type charged particle beam apparatus using plural beams, in e.g., JP-A-2007-317467, having disclosed the configuration of a lens array, so that use may be made of the known lens array.

The primary beams 203 individually focused by the lens array 209 fall into the beam separator 211. With the present embodiment of the invention, the beam separator 211 is made up of a magnetic prism having a function of causing an outgoing beam track to be reversed in orientation and deflected through 90 degrees against an incident beam track to thereby separate the tracks from each other, however, even if deflection differs in respect of direction and angle, the effects of the present invention are ensured. Furthermore, even in the case of using a beam separator other than the magnetic prism, for example, a Wien filter for generating a magnetic field and an electric field, crossing each other at right angles, in a plane perpendicular to an incident direction of the primary beam, the effects of the present invention are ensured.

In order to avoid occurrence of aberration, caused by the magnetic prism, the plural second electron source images 210a to 210c are formed on an incidence plane of the beam separator 211. The primary beams 203 falling on the beam separator 211 from the upper side in the plane of the figure of FIG. 2 are caused to outgo leftward in the plane of the figure of FIG. 2, whereupon plural third electron source images 220a to 220c, corresponding to the plural second electron source images 210a to 210c, respectively, are formed on a beam outgoing plane of the beam separator 211. In this connection, if the magnetic prism reported in Adv. Imaging and Electron Physics (Ed. Hawkes), Vol. 120, 41, (2001) is adopted for the beam separator 211, this will enable images to be formed on not only the incidence plane and the beam outgoing plane of the prism, but also at positions just halfway through the paths, whereupon tracks on the plane of the images become antisymmetric, so that occurrence of aberration, caused by a prism separator, can be avoided.

The primary beams 203 outgo from the beam separator 211 to thereby form the plural third electron source images 220a to 220c, respectively, subsequently falling on the aberration corrector 212 to be then applied to the electrostatic mirror 213. The primary beams 203 are reflected by the electrostatic mirror 213 to pass through the aberration corrector 212 again, subsequently falling on the beam separator 211. In consequence, the primary beams 203 pass through the aberration corrector 212 once before and after reflection by the electrostatic mirror 213, that is, twice altogether. Since primary beam tracks make up an electron optical system of the same size before and after passing through the aberration corrector 212, fourth electron source images 220a to 220c are formed on an incidence plane of the beam separator 211, that is, at respective positions identical to those for the third electron source images, as described in more detail later on.

The primary beams 203 incident on the beam separator 211 again from the left-hand side in the plane of the figure of FIG. 2 are caused to outgo downward in the plane of the figure this time, thereby forming fifth electron source images 221a to 221c on a beam outgoing plane of the beam separator 211. The objective lens 214 is an electromagnetic lens for causing the fifth electron source images 221a to 221c to be scaled down before projection. Aberrations occurring to respective elements of the electron optical system are corrected by virtue of the effect of the aberration corrector 212, and a spread of each of the plural primary beams 203 having reached the wafer 217 as the specimen is sufficiently narrowed down to such an extent as to satisfy resolution necessary for inspection.

The deflector 215 for scanning deflection is of an electrostatic octupole type to be installed inside objective lens. Upon the scanning signal generator 237 inputting a signal to the deflector 215, the plural primary beams 203 passing through the deflector 215 are subjected to a deflection action substantially in the same direction, and substantially by the same angle only, thereby carrying out raster scanning of the wafer 217.

The negative potential has been impressed to the wafer 217 by the retarding power source 219a, thereby forming an electric field for decelerating the primary beams. The retarding power source 219a, and the surface electric field control power source 219b are uniformly controlled by the system controller 235 through the intermediary of the optical system controller 239, as is the case with other optical elements, that is, the electron gun 201, the collimator lens 207, the lens array 209, the beam separator 211, the aberration corrector 212, the electrostatic mirror 213, and the objective lens 214. The stage 218 is controlled by the stage controller 238. The system controller 235 uniformly controls the scanning signal generator 237, and the stage controller 238 in such a way as to inspect a predetermined region on the wafer 217 on a stripe-by-stripe basis, the stripes being lined up in a traveling direction of the stage, while executing calibration beforehand. With the inspection apparatus according to the present embodiment, the stage is continuously on the move in the process of inspection, and the primary beam is controlled so as to sequentially scan stripe-shaped regions through combination of deflection by scanning and movement of the stage. The stripe-shaped region represents a division of a predetermined inspection region, and the predetermined inspection region in whole can be scanned by scanning plural the stripe-shaped regions.

The plural primary beams 203 having reached the surface of the wafer 217 react mutually with material present in the vicinity of the surface of the specimen. As a result, electrons of secondary nature such as backscattered electrons, secondary electrons, Auger electrons, and so forth are emitted from the specimen to be thereby turned into secondary beams 222.

The surface electric field control electrode 216 is an electrode for adjusting strength of an electric field in the vicinity of the surface of the wafer 217 to thereby control respective tracks of the secondary beams 222. The surface electric field control electrode 216 is installed so as to oppose the wafer 217, and a potential either positive or negative, in relation to the wafer 217, or a potential identical to that of the wafer 217 is impressed by the surface electric field control power source 219b. A voltage impressed to the surface electric field control electrode 216 by the surface electric field control power source 219b is adjusted to a suitable value according to the kind of the wafer 217, and an observation target. For example, in the case of aggressively bringing back the secondary beams 222 as generated to the surface of the wafer 217, a negative voltage is impressed to the surface electric field control electrode 216. Conversely, a positive voltage can be impressed to the surface electric field control electrode 216 to prevent the secondary beams 222 from returning to the surface of the wafer 217.

The secondary beams 222 after passing through the surface electric field control electrode 216 are subjected to the focusing effect of the objective lens 214 to be then deflected rightward in the plane of the figure of FIG. 2 by the beam separator 211, thereby reaching the detectors 223a to 223c, respectively. A secondary electron detection system 240 is comprised of the detectors 223a to 223c, an A/D converter 231, the memory 232, the processor 233, and the defect determiner 234. In the secondary electron detection system 240, a detected signal is amplified by amplifiers 230a to 230c, respectively, to be digitized by the A/D converter 231 to be thereby stored as image data once in the memory 232 of the system controller 235. Thereafter, the processor 233 works out various statistics of an image, finally determining whether or not there exists a defect on the basis of defect-determining conditions found by the defect determiner 234 beforehand. Determination results are displayed on the image display device 236. According to a procedure described as above, patterns of regions to be inspected, within the wafer 217, can be sequentially inspected by starting from a region at one end.

Further, the present embodiment with a few variations added thereto can be applied to a lithography apparatus. Main variations are related to two elements, that is, the multi-beams forming unit 102, and the secondary electron detection system 240. In the case of applying the invention to the lithography apparatus, there is the need for a blanker array disposed downstream from the lens array 209 in the multi-beams forming unit 102, for individually turning the electron beams ON/OFF. Further, the secondary electron detection system 240 is applicable to execution of beam calibration, and so forth, which is, however, not an essential mechanism.

Next, the aberration corrector 212, and the electrostatic mirror 213, shown in FIG. 2, will be described in detail with reference to FIGS. 3 to 5.

First, there is described a method for correcting off-axial aberration in the case where there is no reflection by the electrostatic mirror. FIG. 3 schematically shows respective strengths of a quadrupole field, and an octupole field, for correction of the off-axial aberration, and paraxial fundamental rays in the aberration corrector. Assuming that space is expressed by a Cartesian coordinate system based on three axes of x, y, and z, the optical axis of the electron optical system is the z-axis, an off-axial distance away from the optical axis is r $\{=\mathrm{sqrt}\ (x^2+y^2)\}$, the paraxial fundamental rays refers to tracks (axial fundamental rays) of an electron beam outgoing under conditions that an object plane r=0, the gradient of the track against the optical axis dr/dz=1, and tracks (off-axial fundamental rays) of an electron beam outgoing under conditions that an object plane r=1, the track is parallel with the optical axis (dr/dz=0). An electron beam track can be approximately expressed by a second-order differential equation, and the axial fundamental rays, and the off-axial fundamental rays represent two solutions independent from each other. All ideal tracks can be expressed by the axial fundamental rays, and the off-axial fundamental rays.

The aberration corrector is made up by disposing electrostatic quadrupoles, electrostatic octopoles, and magnetic quadrupoles between two collimator lenses 301a, 301b. Electrostatic quadrupole fields each have a strength corresponding to 302a to 302n, respectively, and in FIG. 3, use is made of 14 pieces of the electrostatic quadrupoles. Similarly, electrostatic octupole fields each have a strength corresponding to 303a to 303o (15 pieces), respectively, and magnetic quadrupole fields each have a strength corresponding to 304a, 304b (2 pieces), respectively. In the case where quadrupoles are disposed in an electron optical system, an electron beam track will be no longer rotationally symmetric, and therefore, it is necessary to consider two kinds of fundamental rays in the x-y plane. Accordingly, a track with "a" suffixed thereto among the axial fundamental rays 305 and the off-axial fundamental rays 306, respectively, is meant to be in the x-direction while a track with "b" suffixed thereto, is meant to be in the y-direction.

A diverging lens is required for correction of aberration. Because a diverging lens field cannot be generated with the use of an electron lens that is rotationally symmetric, use is made of a multipole. Aberration (geometrical aberration) occurring due to respective electron beams passing through different tracks can be corrected by superimposing a quadrupole field on an octupole field. Aberration (chromatic aberration) occurring due to variation in electron beam energy can be corrected by generating a quadrupole field in both an electrostatic field and a magnetic field, thereby changing a balance therebetween.

Now, as described in the foregoing, it is necessary to take into consideration the fundamental rays in the x-direction and in the y-direction, respectively. Since the electron optical system basically passes through a rotationally symmetric field outside the aberration corrector, it is necessary for respective tracks in the x-direction and in the y-direction, all-inclusive, inside the aberration corrector, to pass through identical paths. Accordingly, symmetry comes to be important with reference to the electrostatic quadrupole field strengths 302a to 302n, the electrostatic octupole field strengths 303a to 303o, and the magnetic quadrupole field strengths 304a, 304b, respectively. In FIG. 3, respective multipole fields form a symmetric field or anti-symmetric field with respect to symmetry planes 307a to 307c, respectively. For example, in a region A indicated by the arrows, the respective electrostatic quadrupole field strengths, in sub-regions across the symmetry plane 307a serving as the boundary therebetween, are 302a=302g, 302b=302f, 302c=302e, thereby forming a symmetric field while the electrostatic octupole field strengths are 303a=303g, 303b=303f, 303c=303e, thereby forming a symmetric field. The same can be said of a region B indicated by the arrows. When the region A is compared with the region B, it is found that both the electrostatic quadrupole fields, and the magnetic quadrupole fields form fields antisymmetric to each other, across the symmetry plane 307a serving as the boundary therebetween. For example, the magnetic quadrupole field strengths are found inverted in reference numeral such as 304a=−304b. As for the electrostatic octupole fields, there are formed symmetric fields across the symmetry plane 307b serving as the boundary therebetween. As a result of generation of the fields by taking symmetry into consideration, the axial fundamental ray 305a in the x-axis direction, and the axial fundamental ray 305b in the y-axis direction follow respective paths mutually replaced by each other. The same can be said of the off-axial fundamental ray 306a in the x-axis direction, and the off-axial fundamental ray 306b in the y-axis direction. Accordingly, the aberration corrector has a configuration basically identical in size to the configuration of an electron optical system.

Subsequently, there is described a case where the aberration corrector according to the present embodiment is combined with the electrostatic mirror. As described in the foregoing, the symmetry planes exist in the off-axial aberration corrector. If the electrostatic mirror is disposed at the position of the symmetry plane 307b, in FIG. 3, this will cause tracks to be reflected by the electrostatic mirror to follow the previous tracks in the reverse direction, thereby passing through symmetric fields along symmetric paths, respectively. Accordingly, if the electrostatic mirror 213 is disposed behind the region A in FIG. 3, it is possible to reduce the number of the multipole fields shown in FIG. 3 by around one half. FIGS. 4A, 4B each are a view schematically showing respective strengths of multipole fields, and fundamental rays, in the case where the electrostatic mirror is combined with the multipole fields for correction of aberration, FIG. 4A showing the view before reflection by the electrostatic mirror while FIG.

4B shows the view after the reflection by the electrostatic mirror. In FIG. 4B, reference numerals identical to those in FIG. 4A are used, and further, the reference numerals expressing the respective strengths of the multipole fields are denoted by adding (') to the reference numerals, respectively.

A multipole field 410 in FIG. 4A is a field where the aberration corrector 212 in FIG. 2 is formed, the multipole field 410 being made up of the magnetic quadrupole fields in combination with the electrostatic octupole fields. The electrostatic octupole field strengths are the same as those (the electrostatic octupole field strengths 303a to 303o, respectively) disposed in the region A of FIG. 3. The magnetic quadrupole field strengths 404a to 404g, respectively, are substantially the same as the electrostatic quadrupole field strengths 302a to 302g, respectively, disposed in the region A of FIG. 3 and the magnetic quadrupole field strength 404d represents a strength of the electrostatic quadrupole field strength 302d shown in FIG. 3, with the magnetic quadrupole field strength 304a added thereto. That is, a magnetic field forms a quadrupole field while an electrostatic field forms an octupole field. The reason for this is because the octupole fields are symmetric with respect to the symmetry plane 307b in FIG. 3, and the quadrupole fields are antisymmetric with respect to the symmetry plane 307b in FIG. 3. By comparing the multipole field 410 of FIG. 4A with a multipole field 410 of FIG. 4B, it is found that, for example, 303a=303a', 303b=303b' in the octupole fields whereas 404a=−404a', 404b=404b' in the quadrupole fields, indicating the necessity that the octupole field strengths are identical to each other, and the quadrupole field strengths are all reversed in polarity. Because a direction of magnetic force acting on charged particles will vary depending on a traveling direction of the charged particles, the strength of a magnetic multipole field will undergo reversal in polarity following reversal in the traveling direction of the charged particles. If quadrupole fields are generated by a magnetic field, this will cause the polarity of the quadrupole field before reflection by the electrostatic mirror to be reversed after the reflection by the electrostatic mirror, that is, following reversal in the traveling direction of the charged particle beam. This is the reason why the multipole field is made up of the electrostatic octupole fields, and the magnetic quadrupole fields. As a result, axial fundamental rays 405a, 405b', and 405b, 405a' become identical to each other, as shown in FIGS. 4A, and 4B, respectively, so that the axial fundamental rays in the x-direction, and the axial fundamental rays in the y-direction, all-inclusive, are identical to each other. The same can be said of the off-axial fundamental rays.

Figure 4A:
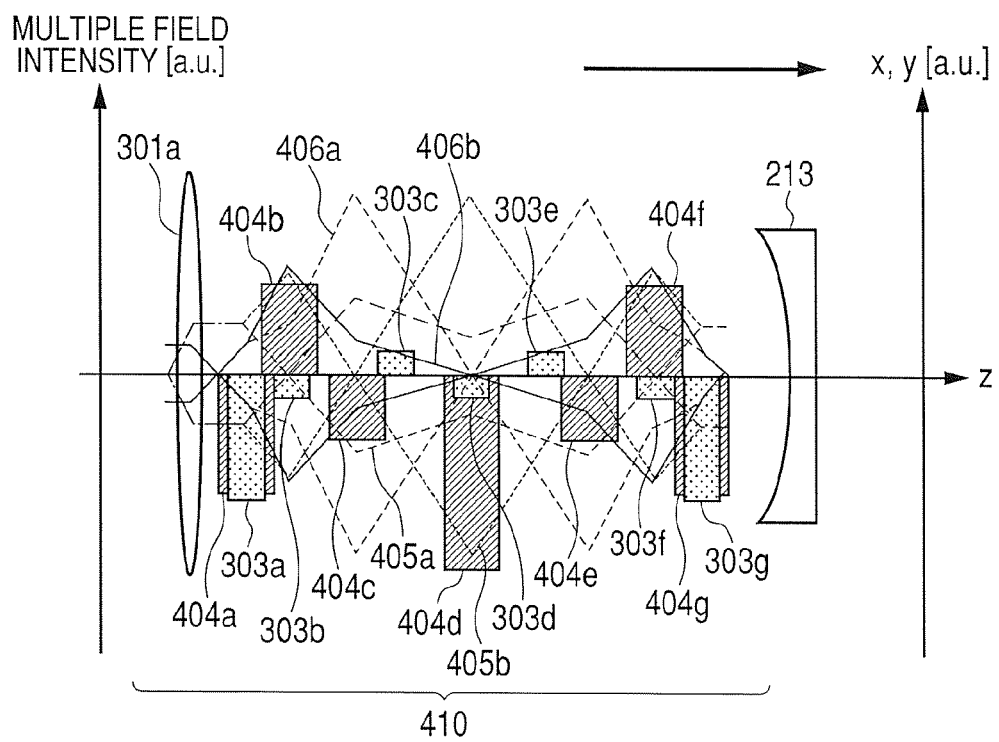
FIGS. 4A, 4B each are a schematic view showing an electrostatic mirror according to the first embodiment of the invention, respective multipole field strengths, and fundamental rays.
Figure 4B:
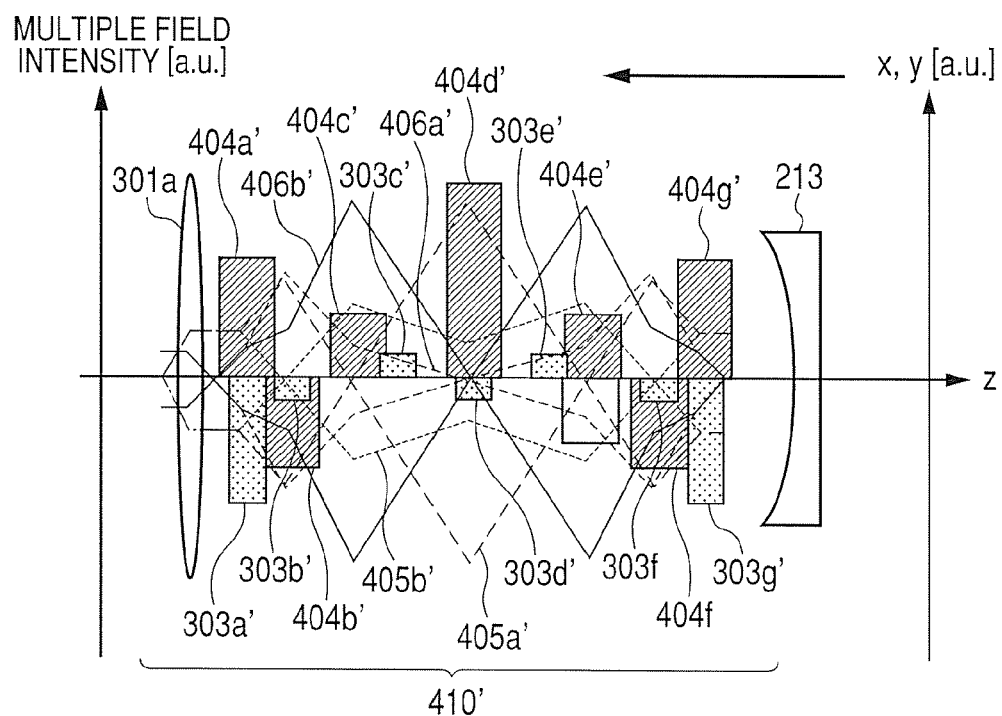
Figure 5:
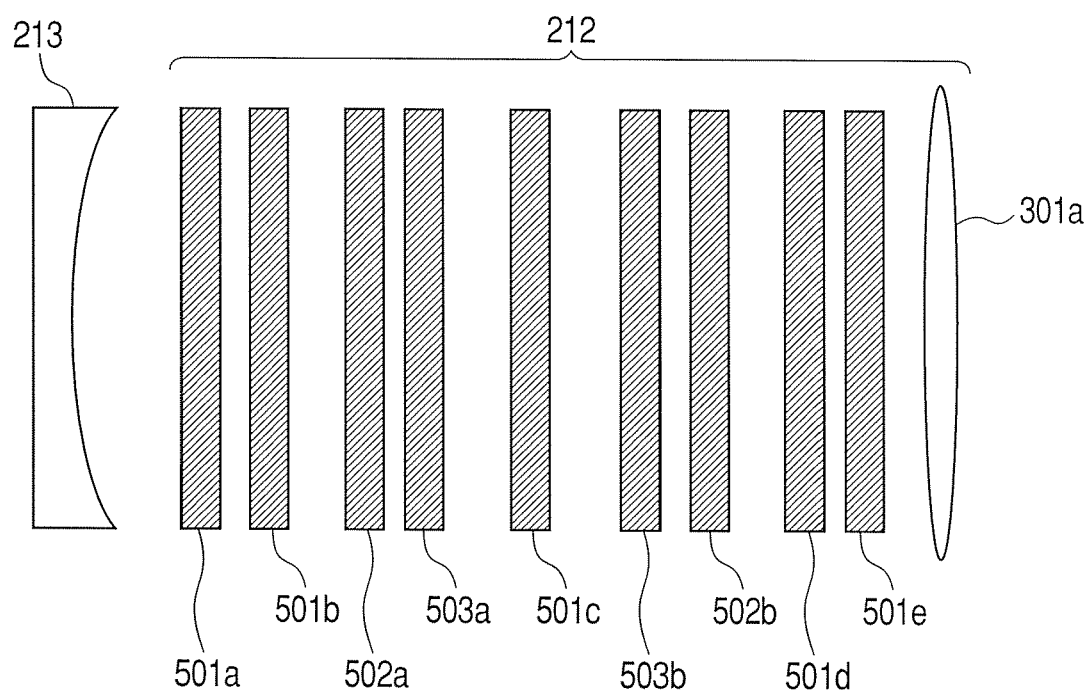
FIG. 5 is a schematic view showing a configuration of an aberration corrector according to the first embodiment.

A configuration of the aberration corrector 212 according to the present embodiment, together with a schematic view of the electrostatic mirror 213, is shown in FIG. 5. Further, FIG. 5 shows the configuration obtained by horizontally flipping a configuration in FIG. 4A, or FIG. 4B from side to side, in order to match the configuration in FIG. 5 in orientation with the configuration in FIG. 2. In FIG. 4A, and FIG. 4B, respectively, there are found five cases where the position of the magnetic quadrupole field coincides with that of the electrostatic octupole field (for example, the magnetic quadrupole field strength 404a and the electrostatic octupole field strength 303a, and so forth) and two cases where the magnetic quadrupole field does not coincide with that of the electrostatic octupole field at the magnetic quadrupole field strength, and the electrostatic octupole field strength, respectively. In consequence, in FIG. 5, a configuration includes five units of electrostatic octopoles doubling as magnetic quadrupoles 501a to 501e, two units of magnetic quadrupoles 502a, 502b, and two units of electrostatic octopoles 503a, 503. The electrostatic octopoles doubling as the magnetic quadrupoles 501a to 501e each may be made up such that the number of poles is twelve, and current and voltage may be adjusted such that a magnetic field and an electrostatic field come to have quadrupoles and octopoles, respectively. Otherwise, components electrically or magnetically insulated from each other may be combined together in such a way as to secure eight electrical poles, and four magnetic poles.

As described in the foregoing, the geometrical aberration is corrected by superimposing the quadrupole field on the octupole field, and the chromatic aberration is corrected by generating the quadrupole field in both the electrostatic field and the magnetic field, thereby changing a balance therebetween. With the configuration shown in FIG. 4A, and FIG. 4B, respectively, since the quadrupole field is generated only in the magnetic field, the chromatic aberration cannot be corrected. Further, in FIGS. 4A, 4B, respectively, the electrostatic octupole field strength 303h shown in FIG. 3 needs be disposed at the position of the electrostatic mirror, which is difficult to implement. The electrostatic octupole field strength 303h shown in FIG. 3 is for use in correction of aperture aberration. Herein, if a configuration shown in, for example, Adv. Imaging and Electron Physics (Ed. Hawkes), Vol. 120, 41, (2001) is adopted as the configuration of the electrostatic mirror, it is possible to correct aperture aberration and chromatic aberration. If there is adopted a configuration whereby the chromatic aberration and the aperture aberration are corrected by the electrostatic mirror 213, and other aberrations are corrected by the aberration corrector 212, this will enable substantially all the aberrations to be corrected. Furthermore, if there is no need for correction of the chromatic aberration and the aperture aberration, the configuration of the electrostatic mirror may be a simpler configuration such as, for example, a configuration whereby a voltage substantially equivalent to an accelerating voltage of an electron beam is impressed to a sheet of a flat electrode. Even if the configuration of the electrostatic mirror is other than that, the effects of the present invention will be ensured.

Second Embodiment

Figure 3:
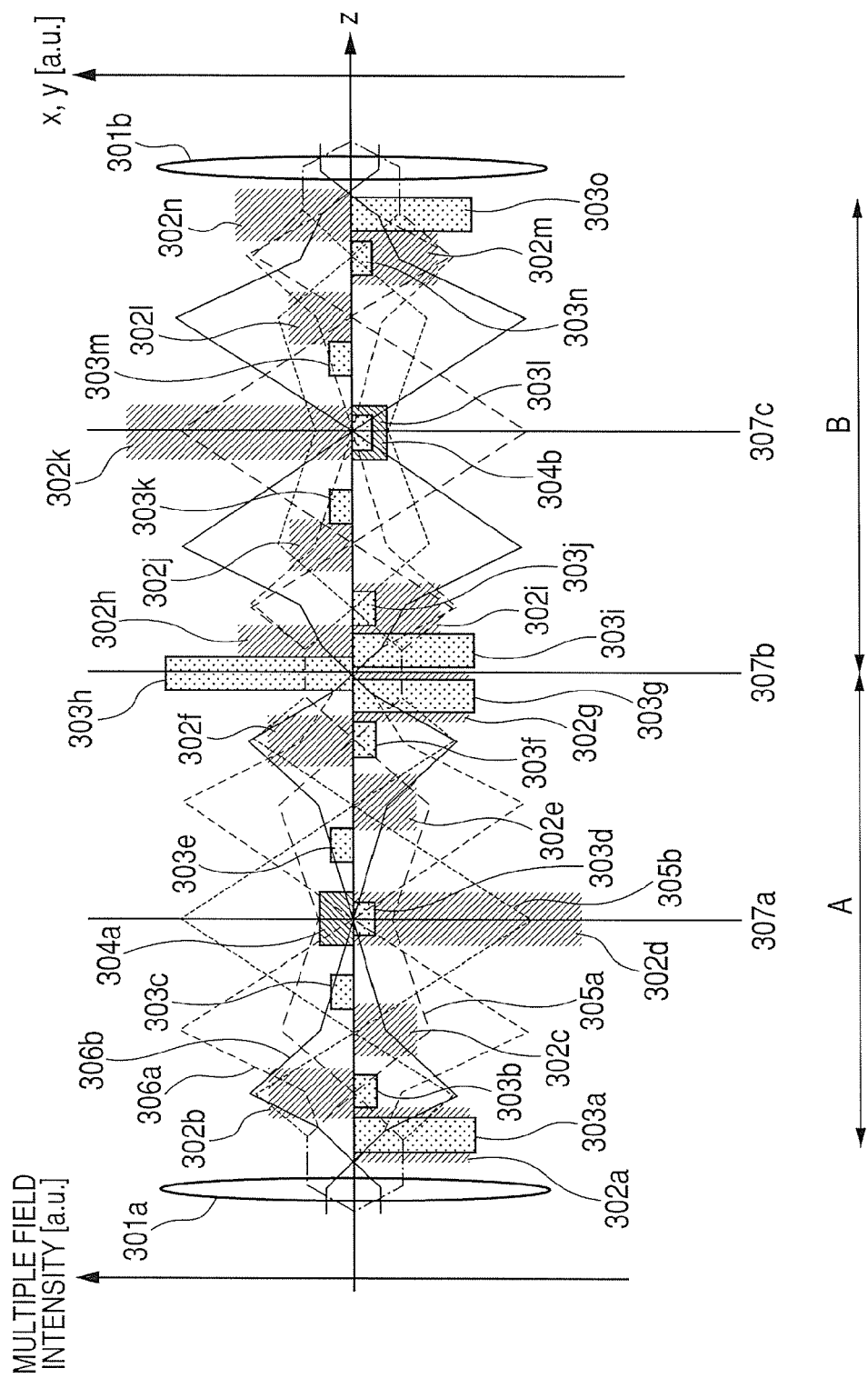
FIG. 3 is a schematic view showing respective strengths of a quadrupole field, and an octupole field, for correction of off-axial aberration, and fundamental rays.

With the first embodiment of the invention, the off-axial aberration corrector shown in FIG. 3 has the configuration wherein the electrostatic mirror is disposed at the position of the symmetry plane 307b. In contrast, with a second embodiment of the invention, there is adopted a configuration wherein an electrostatic mirror is disposed at the respective positions of the symmetry planes 307b, and 307c of the off-axial aberration corrector shown in FIG. 3, thereby disposing a combination of the aberration corrector, and the electrostatic mirror at two locations.

Figure 6:
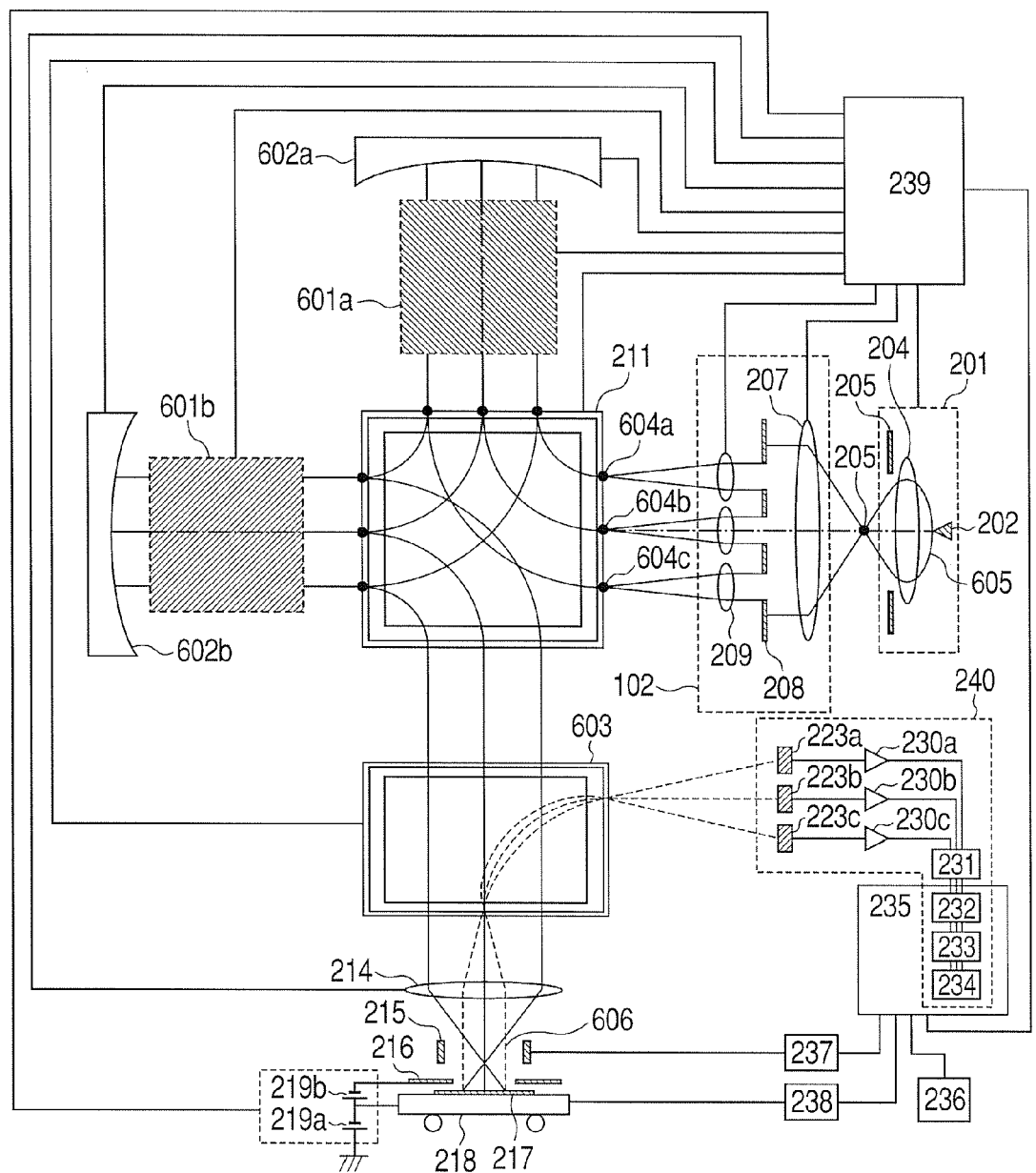
FIG. 6 is a schematic view of a multi-beam type electron beam inspection apparatus according to a second embodiment of the invention.

FIG. 6 is a schematic view of a multi-beam type electron beam inspection apparatus according to the second embodiment of the invention. In FIG. 6, placement of constituent elements including an electron gun 201, a cathode 202, an anode 205, an electromagnetic lens 204, a collimator lens 207, an aperture array 208, and a lens array 209 is turned clockwise through 90 degrees from placement of like constituent elements, shown in FIG. 2, so that those constituent elements are disposed on the right side of a beam separator 211, in the plane of the figure of FIG. 6. The multi-beam type electron beam inspection apparatus is identical in configuration, and function as the multi-beam type electron beam inspection apparatus shown in FIG. 2. In FIG. 6, an aberration corrector 601a, and an electrostatic mirror 602a are disposed on the upper side of the beam separator 211, an aberration corrector 601b, and an electrostatic mirror 602b are disposed on the left side of the beam separator 211, and a beam separator 603, a objective lens 214, a deflector 215 for scanning deflection, and a stage 218 are disposed under the beam separator 211. Further, secondary electron detectors 223a to 223c, and so forth are disposed on the right side of the beam separator 211.

The aberration correctors 601a, 601b, and the electrostatic mirrors 602a, 602b are connected to an optical system controller 239 as in the case of other constituent elements. The configuration of constituent elements, other than the above, and connection thereof are identical to those shown in FIG. 2, omitting therefore description thereof. Further, an aperture for current limiting, an aligner for adjustment of the central axis (the optical axis) of the primary beam, and so forth are also added to the electron optical system although not shown in the figure. Furthermore, it goes without saying that constituent elements (not shown) other than those in a control system, and a circuit system are disposed in a vacuum chamber so as to be operated after the vacuum chamber is evacuated. Further, needless to say, the apparatus is provided with a wafer transfer system for disposing a wafer from outside a vacuum.

Since a method for inspection of a wafer pattern, using the electron beam inspection apparatus according to the present embodiment, is substantially the same as that in the case of the first embodiment, there are described hereinafter main points of the method, differing from the case of the first embodiment. A primary beam 605 emitted from the electron gun 201 passes through the collimator lens 207, the aperture array 208, and the lens array 209 to be individually focused, thereby forming plural second electron source images 604a to 604c, respectively, to fall on the beam separator 211. With the present embodiment, the beam separator 211 is made up of a magnetic prism having a function of causing an outgoing beam track to be reversed in orientation, and deflected through 90 degrees against an incident beam track to thereby separate the tracks from each other, as with the case of the first embodiment. Further, as described with reference to the first embodiment, the effects of the present invention are ensured even in the case where a magnetic prism differing in respect of deflection direction and deflection angle is adopted for the beam separator, or in the case of adopting a beam separator other than the magnetic prism, such as the Wien filter, and so forth. In order to avoid occurrence of aberration, caused by the magnetic prism, the plural second electron source images 604a to 604c are formed on an incidence plane of the beam separator 211. Further, as described with reference to the first embodiment, the plural second electron source images 604a to 604c, formed on the incidence plane of the beam separator 211, are projected on the beam outgoing plane as well as the incidence plane of the beam separator 211 every time those images pass therethrough, although description by referring to reference numerals is omitted, so that occurrence of aberration, caused by the beam separator 211, is avoided.

The primary beams 605 emitted from the right side in the plane of the figure of FIG. 6 to fall on the beam separator 211 are emitted upward in the plane of the figure of FIG. 6, falling on the aberration corrector 601a to be subsequently applied to the electrostatic mirror 602a. The primary beams 605 are reflected by the electrostatic mirror 602 to thereby pass through the aberration corrector 601a again, falling on the beam separator 211. The primary beams 605 falling again on the beam separator 211 from the upper side in the plane of the figure of FIG. 6 are caused to outgo leftward in the plane of the figure this time to similarly fall on the aberration corrector 601b to be applied to the electrostatic mirror 602b, whereupon the primary beams 605 are reflected by the electrostatic mirror 602b to pass through the aberration corrector 601b again before falling on the beam separator 211, to thereby outgo downward in the plane of the figure. In consequence, the primary beams 605 pass through the aberration correctors 601a, 601b, respectively, once before, and after reflection by the electrostatic mirrors 602a, 602b, respectively.

The primary beam 605 outgoing from the beam separator 211 falls on the beam separator 603. The beam separator 603 is used for the purpose of separating a secondary beam 606 from the primary beam 605, and with the present embodiment, the Wien filter for generating a magnetic field and an electric field, crossing each other at right angles, in a plane substantially perpendicular to an incident direction of the primary beam, thereby giving electrons passing therethrough a deflection angle corresponding to energy of the electrons, is adopted as the beam separator. Further, with the present embodiment, a magnetic field strength, and an electric field strength are set so as to cause the primary beam to undergo rectilinear propagation, and further, an electromagnetic strength is adjusted and controlled such that a secondary electron beam incoming from an opposite direction is deflected by a desired angle. In the case of taking into account the effect of aberration occurrence caused by the Wien filter, an image-forming plane of the primary beam, that is, a plane where the plural second electron source images 604a to 604c are projected is preferably disposed in such a way as to match a height of the beam separator 603. For that purpose, it need only be sufficient to add not less than one electromagnetic lens, or electrostatic lens between the beam separator 603, and the beam separator 211.

Still further, with the present embodiment, a spot where the direction of the electron beam is reversed exists at three locations including a location where the secondary beams are generated on the wafer 217 by the primary beams. With only one unit of the magnetic prism (the beam separator 211) having the deflection angle of 90 degrees, insufficiency of space results, so that use is made of a form adopting a combination of the beam separator 211 with the Wien filter (the beam separator 603), however, even if a form other than that is adopted, the effects of the present invention can be ensured. If use is made of, for example, a magnetic prism having a deflection angle of 108 degrees, the spot where the direction of the electron beam is reversed can be secured at three locations even with the use of only one unit of the beam separator.

As shown in the first embodiment, the primary beam 605 passes through the beam separator 603 to be subsequently subjected to a focusing action by the objective lens 214, and is applied to the surface of a wafer 217 as a specimen. A system controller 235 uniformly controls a scanning signal generator 237, and a stage controller 238 in such a way as to inspect a predetermined region on the wafer 217 on a stripe-by-stripe basis, the stripes being lined up in the traveling direction of the stage, while executing calibration beforehand. With the inspection apparatus according to the present embodiment, the stage is continuously on the move in the process of inspection, and the primary beam is controlled so as to sequentially scan stripe-shaped regions through combination of deflection by scanning and movement of the stage.

Aberration occurring to respective elements of the electron optical system are corrected by virtue of the respective effects of the aberration correctors 601a, 601b, and a spread of each of the plural primary beams 603 having reached the wafer 217 as the specimen is sufficiently narrowed down to such an extent as to satisfy resolution necessary for inspection.

The secondary beams 606 emitted from the wafer 217 are subjected to the focusing effect of the objective lens 214 to be then deflected rightward in the plane of the figure of FIG. 6 by the beam separator 603, thereby reaching detectors 223a to 223c, respectively. Adjustment of the electric field strength, processing of detector signals, and so forth are executed by the surface electric field control electrode 216 in the same way as in the case of the first embodiment.

Further, the present embodiment with a few variations added thereto can be applied to a lithography apparatus. Main variations are related to two elements, that is, the multi-beams forming unit 102, and the secondary electron detection system 240. In the case of applying the invention to the lithography apparatus, there is the need for a blanker array disposed downstream from the lens array 209 in the multi-beams forming unit 102, for individually turning the electron beams ON/OFF. Further, the secondary electron detection system 240 is applicable to execution of beam calibration, and so forth, which is, however, not an essential mechanism.

Next, the aberration correctors 601a, 601b, and the electrostatic mirrors 602a, 602b, shown in FIG. 6, will be described in detail hereinafter with reference to FIG. 3, and FIGS. 7 to 9.

As previously described, the electrostatic mirror is disposed at the respective positions of 307a, 307c among the symmetry planes of the aberration corrector in FIG. 3. If the electrostatic mirror is disposed at the position of the symmetry plane 307b, in FIG. 3, this will cause respective tracks of the electron beams to be reflected by the electrostatic mirror to thereby follow the previous tracks in the reverse direction, passing through symmetric fields along symmetric paths, respectively, so that the number of the multipole fields in the region A can be reduced by around one half. Further, if the respective tracks of the electron beams outgoing from the region A is considered in the case where the electrostatic mirror is disposed at the position of the symmetry plane 307c, the respective tracks will pass through symmetric fields along symmetric paths, respectively, thereby enabling the number of the multipole fields in the region B to be reduced by around one half. That is, it is the aberration corrector 601a, and the electrostatic mirror 602a, in FIG. 6, that constitute a configuration for attaining the respective strengths of multipole fields, and the fundamental rays, in the region A, whereas it is the aberration corrector 601b, and the electrostatic mirror 602b, in FIG. 6, that constitute a configuration for attaining the respective strengths of multipole fields, and the fundamental rays, in the region B. Since the regions A, B, in FIG. 3, are symmetric, or anti-symmetric fields, and tracks across the symmetry plane 307b serving as the boundary therebetween, description of either of the regions is sufficient. Accordingly, mention will be hereinafter made of the region A only, that is, the aberration corrector 601a, and the electrostatic mirror 602a, in FIG. 6.

Figure 7:
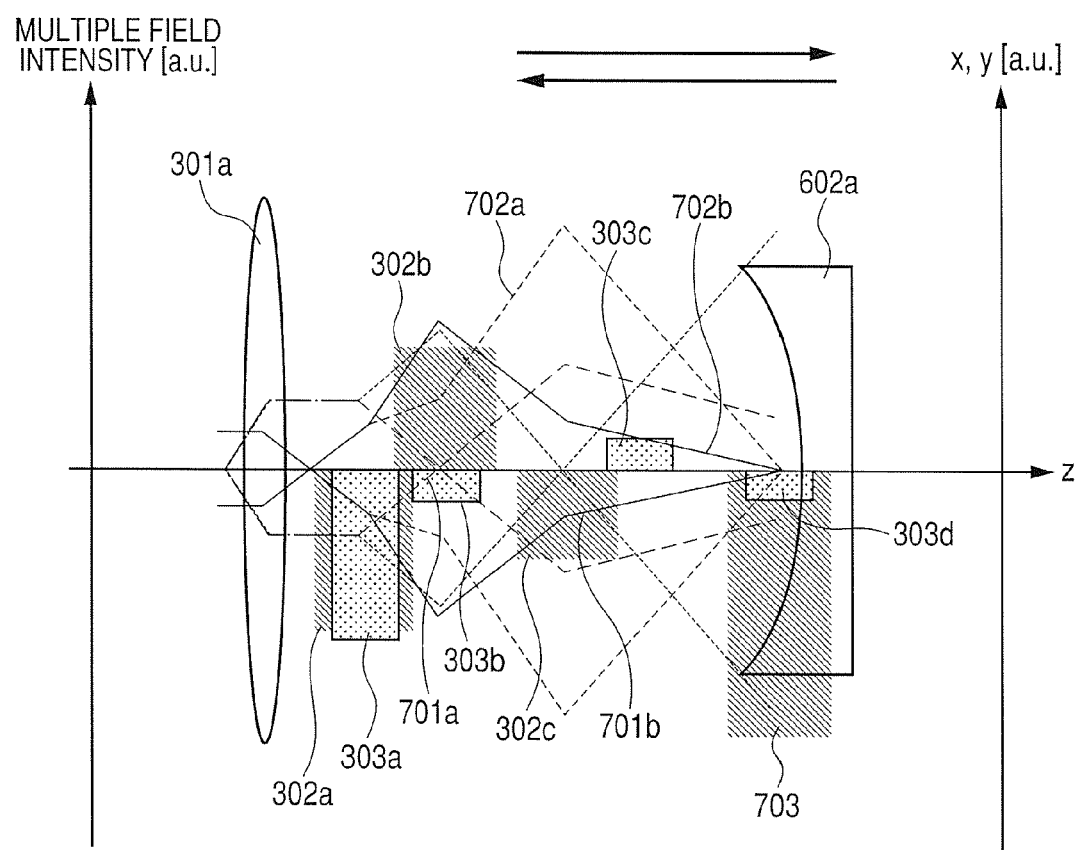
FIG. 7 is a schematic view showing an electrostatic mirror according to the second embodiment of the invention, respective multipole field strengths, and fundamental rays.

FIG. 7 is a view schematically showing respective strengths of multipole fields, and fundamental rays, according to the present embodiment, in the case where the electrostatic mirror is combined with the multipole fields for correction of aberration. As described in the first embodiment, it need only be sufficient to form the multipole fields with an electrostatic field if the multipole fields are symmetric with respect to the symmetry plane as the boundary while forming the multipole fields with a magnetic field if the multipole fields are antisymmetric with respect to the symmetry plane as the boundary. Since all the multipole fields, and electron beam tracks are symmetric at the symmetry plane 307a in FIG. 3, both the quadrupole field, and the octupole field are electrostatic. More specifically, in FIG. 7, the multipole fields making up the aberration corrector come to have the electrostatic quadrupole field strengths 302a to 302c, 703, and the electrostatic octupole field strengths 303a to 303d, and the aberration corrector can be implemented by a combination of the electrostatic mirror 602a with the collimator lens 301a. At this point in time, the electrostatic quadrupole field strength 703 becomes equivalent to the electrostatic quadrupole field strength 302d shown in FIG. 3, with the electrostatic quadrupole field strength 304a added thereto.

Figure 8A:
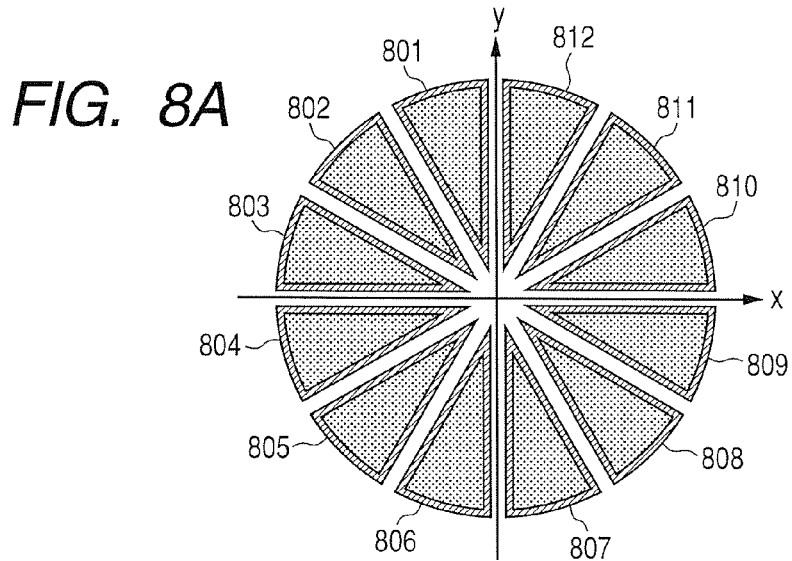
FIGS. 8A to 8E each are a view showing a configuration for superimposing an electrostatic mirror field according to the second embodiment of the invention, on the multipole fields, and a method for implementing the configuration.
Figure 8B:
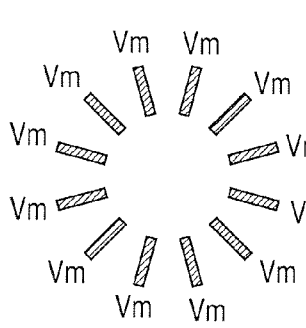
Figure 8C:
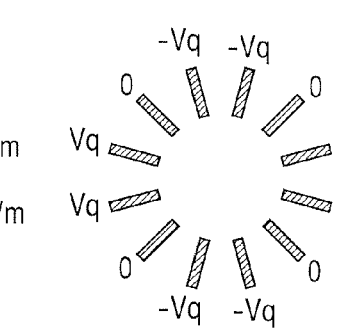
Figure 8D:
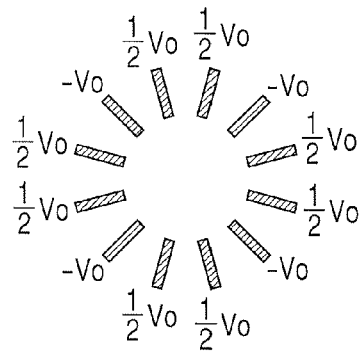
Figure 8E:
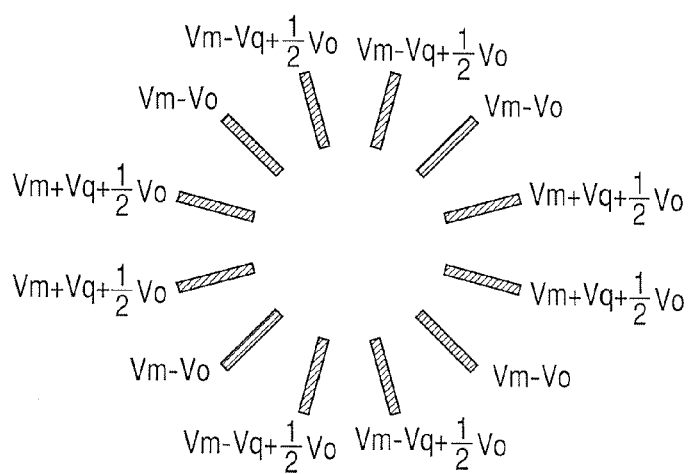

Herein, a multipole for producing the electrostatic quadrupole field strength 703, and the electrostatic quadrupole field strength 302d, respectively, need be disposed at the position of the electrostatic mirror 602a, however, a quadrupole field is indispensable for formation of the fundamental ray, and therefore, the electrostatic quadrupole field strength 703 cannot be omitted. Accordingly, with the present embodiment, an electrode for generating a reflection potential of the electrostatic mirror is divided in shape so as to have 12 poles, thereby superimposing an electrostatic mirror field on multipole fields. FIGS. 8A to 8E each are a view showing a configuration for superimposing the electrostatic mirror field on the multipole fields, and a method for implementing the configuration. FIG. 8A shows a shape of an electrode for generating the reflection potential of the electrostatic mirror 602a, along the x-axis as well as the y-axis. In the case where plural sheets of electrodes are disposed along the direction of the optical axis, voltages differing in value are usually impressed to each of the electrodes of the electrostatic mirror. However, one sheet of electrode is disposed at the same position on the optical axis, and one kind of voltage is impressed thereto. More specifically, it is a common practice that the reflection potential is generated by one sheet of the electrode, and an impressed voltage is only a voltage at the reflection potential. In contrast, with the present embodiment, an electrode of the electrostatic mirror 602a for generating the reflection potential is divided into 12 pieces of electrodes 801 to 812 as shown in FIG. 8A, taking the form of dodecapoles. FIGS. 8B to 8D each show a voltage impressed to the electrodes 801 to 812, respectively, on a component-by-component basis, FIG. 8B shows a reflection potential component, FIG. 8C shows an electrostatic quadrupole field potential component, and FIG. 8D shows an electrostatic octupole field potential component. In order to obtain the effect of the electrostatic mirror, a reflection potential Vm is impressed to all the electrodes as shown in FIG. 8B. In order to generates the electrostatic quadrupole field, an electrostatic quadrupole potential Vq is impressed to all the electrodes, as shown in FIG. 8C. In order to generate the electrostatic octupole field, an electrostatic octupole potential Vo is impressed to all the electrodes, as shown in FIG. 8D. If a voltage at the sum of the potential components shown in FIGS. 8B to 8D, respectively, is impressed to the respective electrodes, this will enable the three fields to be superimposed one another. FIG. 8E shows such a state as described, and by impressing respective voltages, shown in FIG. 8E, on the electrodes 801 to 812, in FIG. 8A, respectively, this will enable the electrostatic mirror field to be superimposed on the multipole fields.

Figure 9:
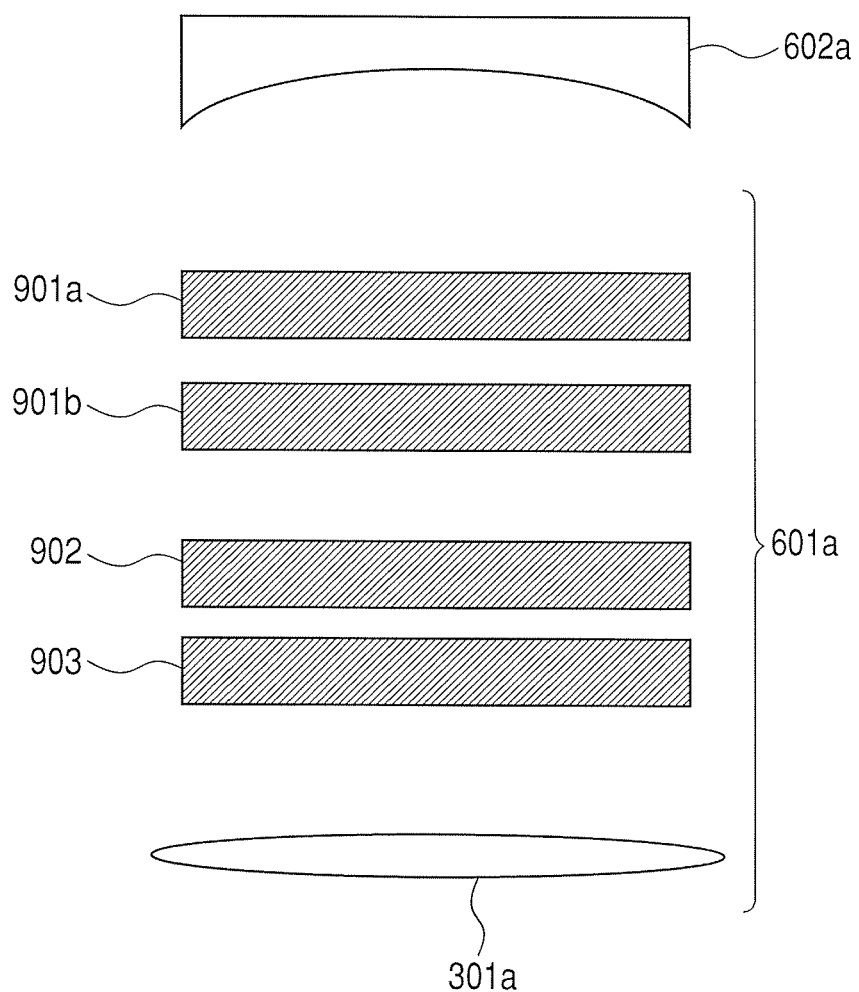
FIG. 9 is a schematic view showing a configuration of an aberration corrector according to the second embodiment.

A configuration of the aberration corrector 601a according to the present embodiment, together with a schematic view of the electrostatic mirror 602a, is shown in FIG. 9. Further, FIG. 9 shows the configuration obtained by rotating a configuration in FIG. 7 counterclockwise by 90 degrees in order to match the configuration in FIG. 9 in orientation with the configuration in FIG. 6. The aberration corrector 601a is comprised of two units of electrostatic octupoles doubling as electrostatic quadrupoles 901a, 901b, one unit of electrostatic quadrupole 902, and one unit of electrostatic octupole 903. A configuration of the electrostatic octupoles doubling as electrostatic quadrupoles can be implemented by making use of the method for field superimposition, described with reference to FIGS. 8A to 8E, whereby the number of the poles is set at 12, and various voltages are adjusted such that respective fields have the quadrupoles, and the octopoles.

Now, as described with reference to FIG. 3, the geometrical aberration can be corrected by superimposing the quadrupole field on the octupole field while the chromatic aberration can be corrected by generating the quadrupole field in both an electrostatic field and a magnetic field, thereby changing a balance therebetween. With the configuration shown in FIG. 7, the quadrupole field is generated only in the electrostatic field, so that the chromatic aberration cannot be corrected. Further, in FIG. 7, the electrostatic octupole field strength $303h$ shown in FIG. 3, for use in correction of the aperture aberration, needs be disposed at the position of the beam separator 211, which is difficult to implement. Accordingly, with the present embodiment as well, if the configuration shown in, for example, Adv. Imaging and Electron Physics (Ed. Hawkes), Vol. 120, 41, (2001), is adopted for the electrostatic mirror as with the case of the first embodiment, it is possible to correct both the aperture aberration and the chromatic aberration. If there is adopted a configuration whereby the chromatic aberration and the aperture aberration are corrected by the electrostatic mirrors 602a, 602b, and other aberrations are corrected by the aberration correctors 601a, 601b, this will enable substantially all the aberrations to be corrected. Furthermore, if there is no need for correction of the chromatic aberration and the aperture aberration, needless to say, the configuration of the electrostatic mirror may be a simpler configuration, or even if the configuration of the electrostatic mirror is other than that, the effects of the present invention will be ensured.

Third Embodiment

With the first embodiment, since the position of the electrostatic octupole field strength $303h$ in the aberration corrector, shown in FIG. 3, coincides with the position of the electrostatic mirror 213, an electrostatic octupole field strength corresponding to the electrostatic octupole field strength $303h$ is not disposed. In contrast, with the second embodiment, there is shown the method for superimposing the electrostatic mirror field on the multipole fields by devising a novel configuration for the electrostatic mirror 602a although the respective positions of the electrostatic quadrupole field strength $302d$, and the electrostatic octupole field strength $303d$, in the off-axial aberration corrector shown in FIG. 3, coincide with the position of the electrostatic mirror 602a. Accordingly, with the present embodiment, there is shown a method for superimposing the electrostatic octupole field strength $303h$ on the electrostatic mirror 213 in the configuration of the apparatus according to the first embodiment. Since the present embodiment is identical to the first embodiment except for the configuration of the electrostatic mirror 213, there is given description concerning only the configuration of the electrostatic mirror 213, and a method for field imposition. For items other than those, reference is to be made to the first embodiment.

Figure 10A:
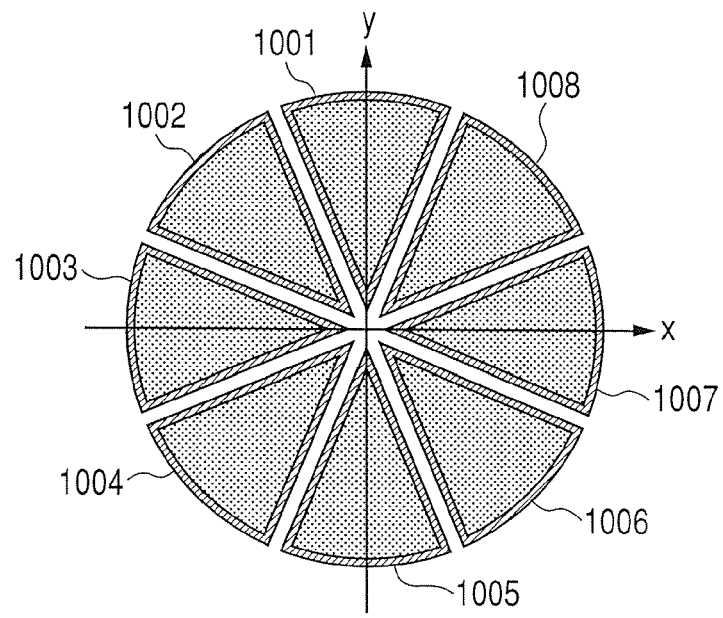
FIGS. 10A to 10D each are a view showing a configuration for superimposing an electrostatic mirror field according to a third embodiment of the invention, on the multipole fields, and a method for implementing the configuration.
Figure 10B:
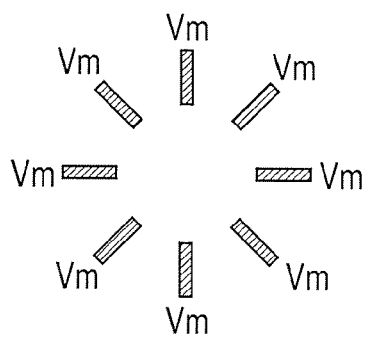
Figure 10C:
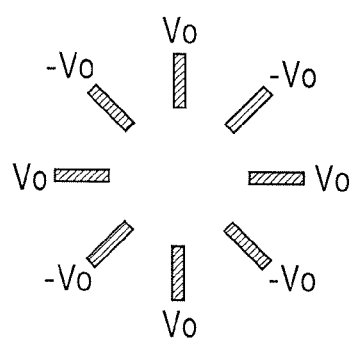
Figure 10D:
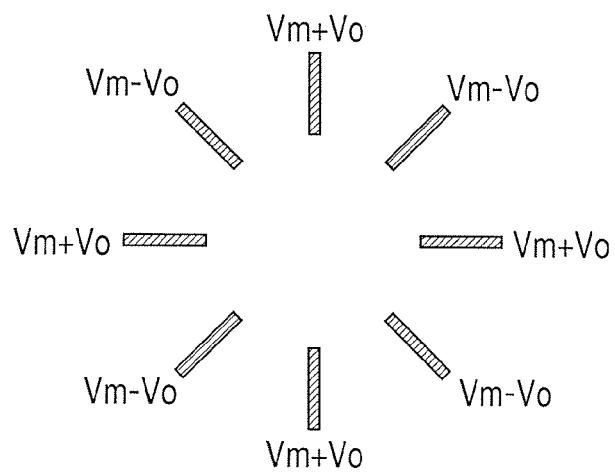

FIGS. 10A to 10D each are a view showing a configuration for superimposing the electrostatic mirror field on the multipole fields, and a method for implementing the configuration. FIG. 10A shows respective shapes of electrodes for generating the reflection potential of the electrostatic mirror 213, along the x-axis as well as the y-axis. As described in the second embodiment, it is the common practice that the reflection potential is generated by one sheet of the electrode, and the impressed voltage is a voltage only at the reflection potential. In contrast, with the present embodiment, an electrode for generating the reflection potential of the electrostatic mirror 213 is divided into 8 pieces of electrodes 1001 to 1008, as shown in FIG. 10A, taking the form of a octupole. FIGS. 10B to 10C each show a voltage impressed to the electrodes 1001 to 1008, respectively, as divided by the component, FIG. 10B shows a reflection potential component, and FIG. 10C shows an electrostatic octupole field potential component. In order to obtain the effect of the electrostatic mirror, a reflection potential Vm is impressed to all the electrodes as shown in FIG. 10B. In order to generate the electrostatic octupole field, an electrostatic octupole potential Vo is impressed to all the electrodes, as shown in FIG. 10C. If a voltage at the sum of the potential components shown in FIGS. 10B, 10C, respectively, is impressed to the respective electrodes, this will enable the two fields to be superimposed one another. FIG. 10D shows such a state as described, and by impressing respective voltages, shown in FIG. 10D, on the electrodes 1001 to 10008, in FIG. 10A, respectively, this will enable the electrostatic mirror field to be superimposed on the multipole fields.

Fourth Embodiment

With the present embodiment, the aberration corrector according to the first embodiment, or the third embodiment is applied to a projection inspection apparatus.

Figure 11:
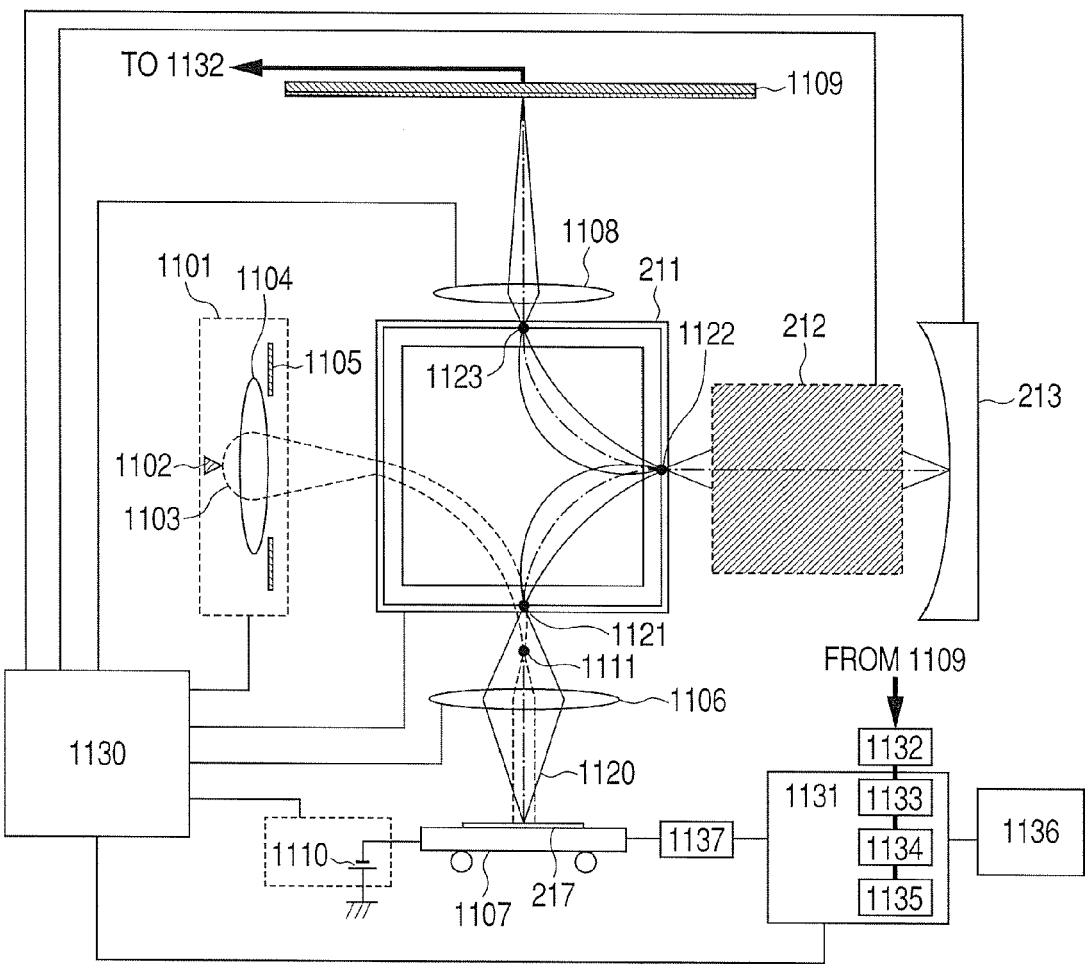
FIG. 11 is a view showing a schematic configuration of a projection electron beam inspection apparatus according to a fourth embodiment of the invention.

FIG. 11 is a view showing a schematic configuration of a projection electron beam inspection apparatus according to a fourth embodiment of the invention.

An electron gun 1101 is comprised of a cathode 1102 made of material low in work function, an anode 1105 higher in potential than the cathode 1102, and an electromagnetic lens 1104 for superimposing a magnetic field on an accelerating electric field formed between the cathode and the anode. With the present embodiment, use is made of a Schottky type anode capable of easily obtaining a large current, and stable in electron emission. A beam separator 211 is disposed in a direction downstream from the electron gun 1101, in which a primary beam 1103 is pulled out of the electron gun 1101. In FIG. 11, an objective lens 1106, and a stage 1107 are disposed under the beam separator 211, an aberration corrector 212, and an electrostatic mirror 213 are disposed on the right side of the beam separator 211, and a projection lens 1108, and a detector 1109 are disposed on the upper side of the beam separator 211. Furthermore, an aperture for current limiting, an aligner for adjustment of the central axis (the optical axis) of the primary beam, an aligner for adjustment of the central axis (the optical axis) of a secondary beam, and so forth are also added to an electron optical system although not shown in the figure. A wafer 217 is placed on the stage 1107 to be thereby shifted.

A negative potential (hereinafter referred to as the retarding potential) is impressed to the wafer 217 as described later on. A wafer holder in such a state as to be electrically continuous with the wafer 217 is interjacent between the wafer 217, and the stage 1107, and a retarding power source 1110 is connected to the wafer holder to thereby impress a desired voltage to the wafer holder, and the wafer 217, respectively.

An optical system controller 1130 is connected the respective elements of the system, namely, the electron gun 1101, the beam separator 211, the objective lens 1106, the aberration corrector 212, the electrostatic mirror 213, and the retarding power source 1110, and further, a system controller 1131 is connected to the optical system controller 1130. A stage controller 1137 is connected to the stage 1107, and further, the detector 1109 is connected to the system controller 1131 via a detection signal processing circuit 1132. A memory 1133, a processor 1134, and a defect determiner 1135 are disposed in the system controller 235, to which an image display device 1136 is connected. Furthermore, it goes without saying that constituent elements (not shown) other than those in a control system, and a circuit system are disposed in a vacuum chamber so as to be operated after the vacuum chamber is evacuated. Further, needless to say, the apparatus is provided with a wafer transfer system for disposing a wafer from outside a vacuum.

Next, there is described hereinafter a method for inspection of a wafer pattern, using the electron beam inspection apparatus.

The primary beam 1103 emitted from the electron source 1102 is accelerated in the direction of the anode 1105 while being subjected to an effect of focusing by the electromagnetic lens 1104, thereby falling on the beam separator 211. As is the case with a common electron gun, the electron gun 1101 is provided with an aperture (not shown), and is made up such that an electron beam in a desired current range is caused to pass through the aperture. If current, voltage, and so forth, to be impressed to the anode 1105, and the electromagnetic lens 1104, respectively, are varied, this will enable current magnitude of the primary beam passing through the aperture to be adjusted to a desired magnitude. Further, an aligner (not shown) for adjustment of the optical axis of the primary beam is disposed between the electron gun 1101, and the beam separator 211, so that the apparatus has such a configuration as to enable correction to be implemented in case that the central axis of the electron beam is deviated from the aperture and the electron optical system, respectively.

With the present embodiment of the invention, the beam separator 211 is made up of a magnetic prism having a function of causing an outgoing beam track to be reversed in orientation, and deflected through 90 degrees against an incident beam track to be thereby separated from each other, however, even in the case of deflection differing in respect of direction and angle, the effects of the present invention are ensured. Furthermore, even in the case of using a beam separator other than the magnetic prism, for example, a Wien filter for generating a magnetic field and an electric field, crossing each other at right angles, in a plane perpendicular to an incident direction of the primary beam, the effects of the present invention are ensured.

The primary beams 1103 emitted from the left side in the plane of the figure of FIG. 11, falling on the beam separator, outgoes downward in the plane of the figure, whereupon an electron source image 1111 is formed on an anterior focal plane of the objective lens 1106. As a result, the primary beams 1103 are lined up substantially in parallel with each other, thereby shining a wide region on the wafer 217 as a specimen at a time.

A negative potential is impressed to the wafer 217 by the retarding power source 1110, thereby forming an electric field for decelerating the primary beams. The retarding power source 1110 is uniformly controlled by the system controller 1131 through the intermediary of the optical system controller 1130, as is the case with other optical elements, that is, the electron gun 1101, the beam separator 211, the objective lens 1106, the electrostatic mirror 213, and the projection lens 1108. The stage 1107 is controlled by the stage controller 1137, and the system controller 1131 controls the stage controller 1137 in such a way as to inspect a predetermined region on the wafer 217 on a stripe-by-stripe basis, the stripes being lined up in a traveling direction of the stage. Further, calibration is executed beforehand.

In the case of causing the primary beams 1103 to collide against the surface of the specimen, the primary beams 1103 react mutually with material present in the vicinity of the surface of the specimen, whereupon electrons of secondary nature such as backscattered electrons, secondary electrons, Auger electrons, and so forth are emitted from the specimen to be thereby turned into secondary beams 1120. Otherwise, it is also possible to enhance a deceleration effect by the agency of the retarding potential to thereby pull back the primary beams 1103 without colliding against the surface of the specimen, whereupon mirror electrons turned from the primary beams 1103 are utilized as the secondary beams 1120.

The secondary beams 1120 are subjected to an accelerating effect caused by the retarding power source 1110, thereby falling on the objective lens. A wafer-projected surface 1121 is formed at the position of an objective lens image plane by the agency of the objective lens in the case of the wafer being an object plane. With the projection inspection apparatus, inspection is executed by enlarging the wafer-projected surface to be projected on the detector The secondary beams 1120 pass through the objective lens, subsequently falling on the beam separator 211 again. In order to avoid occurrence of aberration, caused by the magnetic prism, the wafer-projected surface 1121 is formed on an incidence plane of the beam separator 211. The secondary beams 1120 having fallen on the beam separator 211 from the lower side in the plane of the figure of FIG. 11 are caused to outgo rightward, whereupon a wafer-projected surface 1122 corresponding to the wafer-projected surface 1121 is formed on a beam outgoing plane of the beam separator 211. In this connection, if the magnetic prism reported in Adv. Imaging and Electron Physics (Ed. Hawkes), Vol. 120, 41, (2001) is adopted for the beam separator 211, this will enable images to be formed on not only the incidence plane and the beam outgoing plane of the prism, but also at positions just halfway through the paths, whereupon tracks on the plane of the images becomes antisymmetric, so that occurrence of aberration, caused by a prism separator, can be canceled out.

The secondary beams 1120 outgo from the beam separator 211 to thereby form the wafer-projected surface 1122, subsequently falling on the aberration corrector 212 to be then applied to the electrostatic mirror 213. The secondary beams 1120 are reflected by the electrostatic mirror 213 to pass through the aberration corrector 212 again, subsequently falling on the beam separator 211. The secondary beams 1120 pass through the aberration corrector 212 once before, and after reflection by the electrostatic mirror 213, that is, twice altogether. Since electron optical systems identical in size to each other are made up before, and after the secondary beams 1120 pass through the aberration corrector 212, the wafer-projected surface is again formed on an incidence plane of the beam separator 211. The secondary beams 1120 having fallen on the beam separator 211 from the right side in the plane of the figure of FIG. 11 are caused to outgo upward in the plane of the figure this time, thereby forming a wafer-projected surface 1123 on a beam outgoing plane of the beam separator 211. The wafer-projected surface 1123 is enlarged to be projected on the detector 1109 with the use of the projection lens 1108 to thereby obtain an enlarged projection image of the wafer. In this connection, the projection lens 1108 shown in FIG. 11 is assumed to be an electromagnetic lens, however, there can be a case where the projection lens 1108 is made up of plural electromagnetic lenses, one electrostatic lens, or plural electrostatic lenses, or a combination thereof, for the purpose of enhancement in magnification, correction of image distortion, and so forth.

Aberrations occurring to respective elements of the electron optical system cancel each other out by virtue of the effect of the aberration corrector 212, so that it is possible to obtain the enlarged projection image of the wafer, sharp enough to satisfy resolution necessary for inspection.

The detector 1109 is made up by spatially distributing plural detection devices corresponding to pixel numbers, such as CCD cameras, TDI sensors, and so forth. A signal of the enlarged projection image of the wafer is detected by the detection devices disposed at respective positions corresponding to pixels, and the signal is transmitted to the detection signal processing circuit 1132. The signal as detected is stored as image data once in the memory 1133 of the system controller 1131, and subsequently, the processor 1134 works out various statistics of an image to finally determine whether or not there exists a defect on the basis of defect-determining conditions found by the defect determiner 1135 beforehand. Determination results are displayed on the image display device 1136. According to a procedure described as above, a pattern of regions to be inspected, within the wafer 217, can be sequentially inspected by starting from a region at one end.

As previously described, the aberration corrector 212, and the electrostatic mirror 213 are identical in respect of configuration and function to those according to the first or the third embodiment, omitting therefore description thereof. Reference may be made to FIGS. 3, 4, 5, 9 and 10.

Fifth Embodiment

With the present embodiment, the aberration corrector according to the second embodiment is applied to a projection inspection apparatus.

Figure 12:
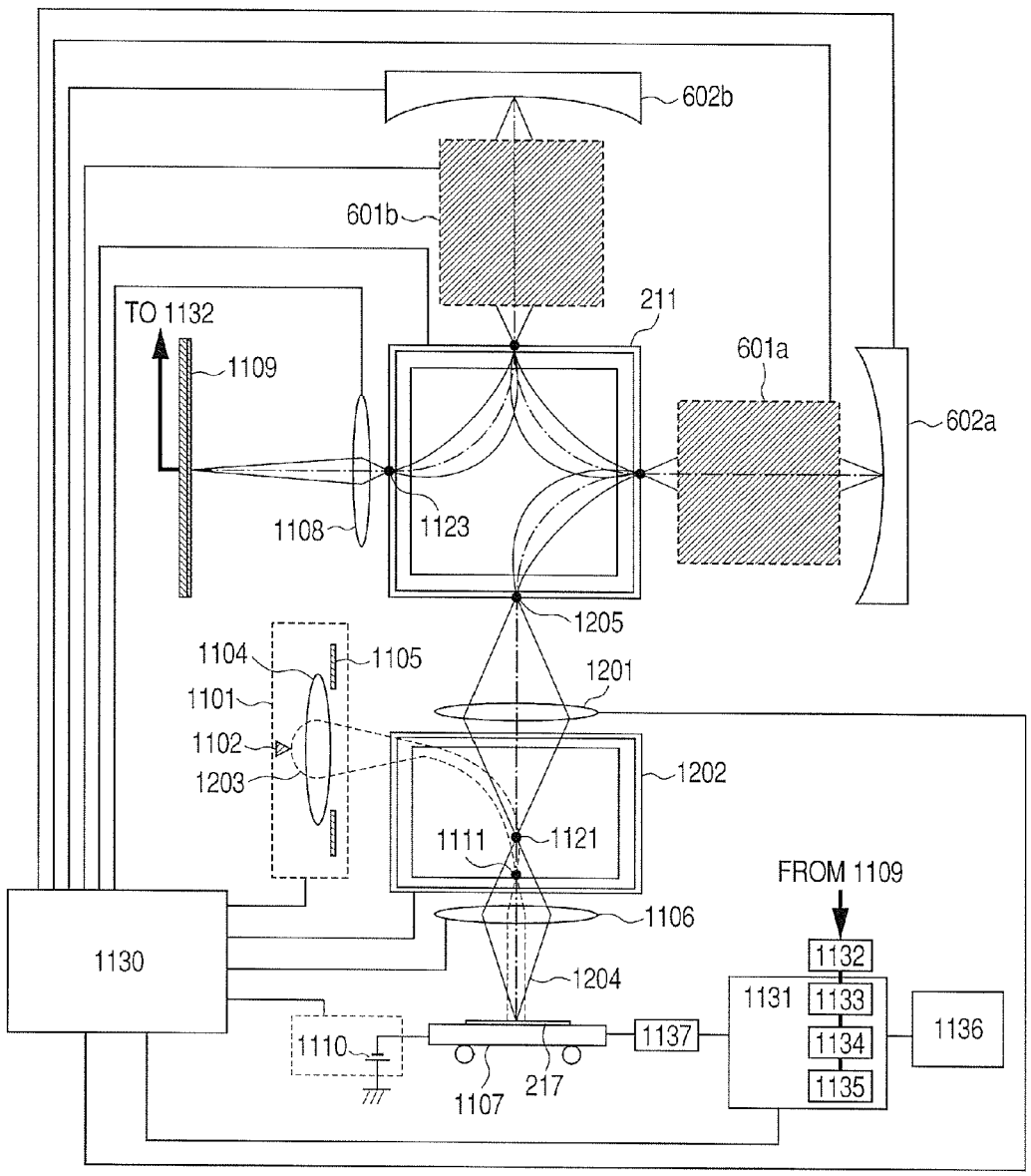
FIG. 12 is a view showing a schematic configuration of a projection electron beam inspection apparatus according to a fifth embodiment of the invention.

FIG. 12 is a view showing a schematic configuration of a projection electron beam inspection apparatus according to a fifth embodiment of the invention. An electron gun 1101 is identical in configuration and function to that in FIG. 11, omitting therefore description thereof. A beam separator 1202 is disposed in downstream from the electron gun 1101, and an objective lens 1106, and a stage 1107 are disposed on the lower side of the beam separator 1202. An intermediate lens 1201 is disposed on the upper side of the beam separator 1202, and further, a beam separator 211 is disposed above the intermediate lens 1201. An aberration corrector 601a, and an electrostatic mirror 602a are disposed on the right side of the beam separator 211, an aberration corrector 601b, and an electrostatic mirror 602b are disposed on the upper side of the beam separator 211, and a projection lens 1108, and a detector 1109 are disposed on the left side of the beam separator 211.

The aberration correctors 601a, 601b, the electrostatic mirrors 602a, 602b, the projection lens 1108, and the beam separator 1202 are connected to an optical system controller 1130 as is the case with constituent elements other than those. The aberration correctors 601a, 601b, and the electrostatic mirrors 602a, 602b are connected to an optical system controller 239 as in the case of other constituent elements. The configuration of constituent elements, other than the above, and connection thereof are identical to those shown in FIG. 11, omitting therefore description thereof. Further, an aperture for current limiting, an aligner for adjustment of the central axis (the optical axis) of the primary beam, and so forth are also added to the electron optical system although not shown in the figure. Furthermore, it goes without saying that constituent elements (not shown) other than those in a control system, and a circuit system are disposed in a vacuum chamber so as to be operated after the vacuum chamber is evacuated. Further, needless to say, the apparatus is provided with a wafer transfer system for disposing a wafer from outside a vacuum.

Since a method for inspection of a wafer pattern, using the electron beam inspection apparatus according to the present embodiment, is substantially the same as that for the fourth embodiment, there will be described hereinafter only points where the present embodiment differs from the fourth embodiment. The primary beam 1203 emitted from the electron gun 1101 falls on the beam separator 1202. The beam separator 1202 is used for the purpose of separating a secondary beam 1204 from the primary beam 1203, and with the present embodiment, the Wien filter for generating a magnetic field and an electric field, crossing each other at right angles, in a plane substantially perpendicular to an incident direction of the primary beam, thereby giving electrons passing therethrough a deflection angle corresponding to energy of the electrons, is adopted. Further, with the present embodiment, a magnetic field strength, and an electric field strength are set so as to cause the primary beam to undergo rectilinear propagation, and further, an electromagnetic strength is adjusted and controlled such that a secondary electron beam incoming from an opposite direction is deflected by a desired angle. In order to take into account the effect of aberration occurrence caused by the Wien filter, the wafer-projected surface 1121 of the secondary beam is preferably disposed in such away as to match a height of the beam separator 1202. Detail will be described later on.

The primary beam 1203 having passed the beam separator 1202 forms the electron source image 1111 on the anterior focal plane of the objective lens 1106, thereby shining a wide region on the wafer 217 at a time. The stage 1107 is controlled by the stage controller 1137, and the system controller 1131 controls the stage controller 1137 in such a way as to inspect a predetermined region on the wafer 217 on a stripe-by-stripe basis, the stripes being lined up in a traveling direction of the stage. Further, calibration is executed beforehand.

The Secondary beams 1204 are generated, and are subjected to an accelerating effect of the retarding potential, thereby falling on the objective lens. The wafer-projected surface 1121 is formed at the position of the objective lens image plane by the agency of the objective lens in the case of the wafer being an object plane. As previously described, the wafer-projected surface 1121 of the secondary beams is disposed in such away as to match the height of the beam separator 1202 in order to avoid the effect of the aberration caused by the beam separator 1202. Further, as described in the fourth embodiment, in order to avoid occurrence of the aberration, caused by the magnetic prism, the wafer-projected surface is formed on an incidence plane of the beam separator 211. The intermediate lens 1201 is for use in adjusting power of a lens to enable the wafer-projected surface 1121 to be formed on the incidence plane of the beam separator 211. With the present embodiment, the intermediate lens 1201 is assumed to be an electromagnetic lens, however, even in the case of using an electrostatic lens, the effects of the invention will be ensured.

The secondary beams 1204 pass through the objective lens, the beam separator 1202, and the intermediate lens 1201 to subsequently fall on the beam separator 211, whereupon the intermediate lens 1201 project the wafer-projected surface 1121, thereby forming a wafer-projected surface 1205 on the incidence plane of the beam separator 211. With the present embodiment as well, the beam separator 211 is made up of a magnetic prism having a function of causing an outgoing beam track to be reversed in orientation and deflected through 90 degrees against an incident beam track to thereby separate the tracks from each other as in the case of the fourth embodiment. However, as described in the fourth embodiment, the effects of the present invention are ensured even in the case where a magnetic prism differing in respect of deflection direction and deflection angle is adopted for the beam separator, or in the case of adopting a beam separator other than the magnetic prism, such as a Wien filter, and so forth. Further, as described with reference to the fourth embodiment, the wafer-projected surface 1205 formed on the incidence plane of the beam separator 211 is projected on the beam outgoing plane as well as the incidence plane of the beam separator 211 every time the wafer-projected surface passes therethrough although description by referring to reference numerals is omitted, so that occurrence of aberration, caused by the beam separator 211, is avoided. Further, with the present embodiment, a spot where the direction of the electron beam is reversed exists at three locations including a location where the secondary beams are generated on the wafer 217 by the primary beams. With only one unit of the magnetic prism (the beam separator 211) having the deflection angle of 90 degrees, insufficiency of space results, so that use is made of a form adopting a combination of the beam separator 211 with the Wien filter (the beam separator 1202), however, even if a form other than that is adopted, the effects of the present invention can be ensured. If use is made of, for example, a magnetic prism having a deflection angle of 108 degrees, the spot where the direction of the electron beam is reversed can be secured at three locations even with the use of only one unit of the beam separator.

The secondary beams 1204 having fallen on the beam separator 211 from the lower side in the plane of the figure of FIG. 12 are caused to outgo rightward in the plane of the figure to fall on the aberration corrector 601a to be subsequently applied to the electrostatic mirror 602a. The secondary beams 1204 are reflected by the electrostatic mirror 602a to pass through the aberration corrector 601a again, thereby falling on the beam separator 211. The secondary beams 1204 having fallen on the beam separator 211 again from the right side in the plane of the figure are caused to outgo upward in the plane of the figure this time to similarly fall on the aberration corrector 601b to be applied to the electrostatic mirror 602b, whereupon the secondary beams 1204 are reflected by the electrostatic mirror 602b to pass through the aberration corrector 601b again to subsequently fall on the beam separator 211, thereby outgoing leftward in the plane of the figure. In consequence, the secondary beams 1204 pass through the aberration correctors 601a, 601b, respectively, once before, and after reflection by the electrostatic mirrors 602a, 602b, respectively.

The secondary beams 1204 outgoing from the beam separator 211 are caused to pass through the projection lens 1108, thereby reaching the detector 1109. At this point in time, a wafer-projected surface 1123 is enlarged by the projection lens 1108 to be projected on the detector 1109, whereupon an enlarged projection image of the wafer is obtained. As is the case with FIG. 11, the projection lens 1108 is assumed to be an electromagnetic lens, however, there can be a case where the projection lens 1108 is made up of plural electromagnetic lenses, one electrostatic lens, or plural electrostatic lenses, or a combination thereof.

Aberrations occurring to respective elements of the electron optical system cancel each other out by virtue of the respective effects of the aberration correctors 601a, 601b, so that it is possible to obtain the enlarged projection image of the wafer, sharp enough to satisfy resolution necessary for inspection. As is the case with the fourth embodiment, a signal of the enlarged projection image of the wafer, sent out from the detector 1109, is transmitted to the detection signal processing circuit 1132 to be thereby processed through the memory 1133, the processor 1134, and the defect determiner 1135, within the system controller 1131, whereupon determination on whether or not there exists a defect on the basis of defect-determining conditions. Determination results are displayed on the image display device 1136.

As previously described, the aberration correctors 601a, 601b, and the electrostatic mirrors 602a, 6012b are identical in respect of configuration and function to those according to the second embodiment, omitting therefore description thereof. Reference may be made to FIGS. 3, 6, 7, and 8.

Sixth Embodiment

With the first embodiment, the configuration of the electrostatic mirror to which a common electrostatic mirror is applicable is not described in detail whereas with the second to fifth embodiments, there is described the configuration for superimposing the electrostatic mirror field on the multipole fields by dividing the electrode of the electrostatic mirror for generating the reflection potential, as shown in FIGS. 8, and 10. With the present embodiment, there is described a configuration wherein an electrode for generating the reflection potential of the electrostatic mirror is divided in the shape of concentric circles to be disposed as plural electrodes.

Figure 13A:
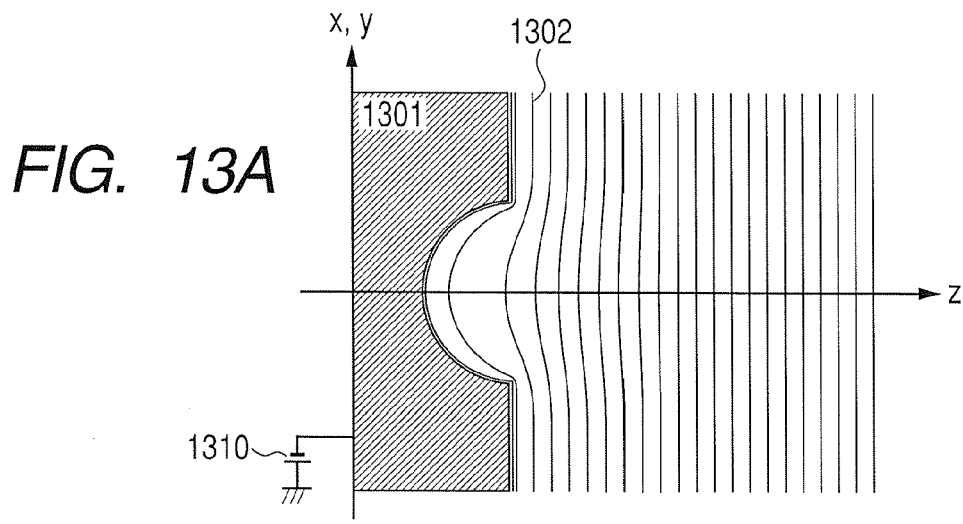
FIGS. 13A to 13C each are a schematic view showing a shape of an electrode for generating the reflection potential of an electrostatic mirror according to a sixth embodiment of the invention.
Figure 13B:
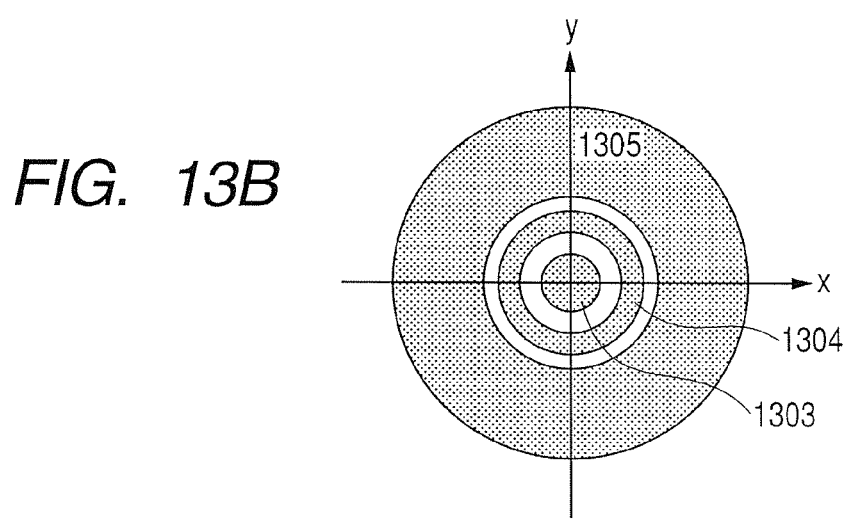
Figure 13C:
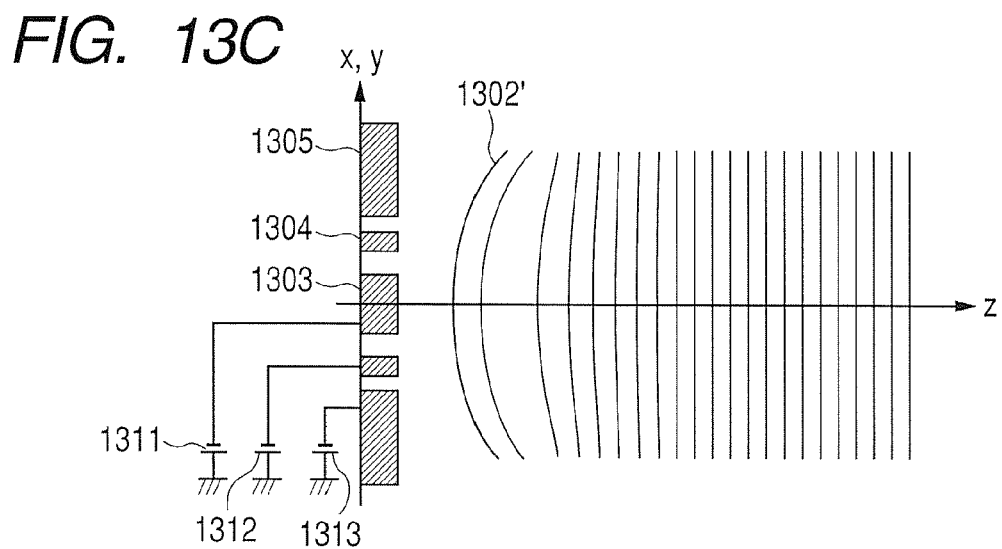

FIGS. 13A to 13C each are a schematic view showing a shape of the electrode for generating the reflection potential of the electrostatic mirror. FIG. 13A is a schematic view of an electrode conventional in configuration, showing an electrode 1301 for generating a reflection potential when the electrostatic mirror is used as the aberration corrector, a reflection voltage supply source 1310 for impressing a reflection voltage to the electrode 1301, and a state of an equipotential plane 1302 formed in the vicinity of the electrode 1301, as seen in the z-x plan view (or the z-y plan view). In order to enable the electrostatic mirror to function as the aberration corrector, it is necessary for a reflecting surface of the electrostatic mirror to act as a concave mirror. For this reason, it is necessary for the equipotential plane 1302 to have a concave surface at a potential repulsive of a charge particle, and therefore, the electrode 1301 is rendered concave in shape as shown in FIG. 13A while a negative voltage is impressed to the reflection voltage supply source 1310. For example, in Adv. Imaging and Electron Physics (Ed. Hawkes), Vol. 120, 41, (2001), there is described that an electrode for generating the reflection potential is concave in surface shape.

In contrast, a shape of the electrode for generating the reflection potential of the electrostatic mirror according to the present embodiment has a configuration wherein plural electrodes in the shape of concentric circles are arranged on a plane. FIG. 13B is a schematic view showing the shape of the electrode, on the x-y plane thereof, and FIG. 13C is a schematic view showing the shape of the electrode, on the z-x, or the z-y plane thereof. In FIG. 13C, an equipotential plane 1302' is also shown. With the present embodiment, it is assumed that the electrode (reflection electrode) for generating the reflection potential of the electrostatic mirror is made up of three sheets of electrodes 1303 to 1305 and reflection voltage supply sources 1311 to 1113, for individually impressing a voltage to the respective electrodes, are connected thereto. In order to render the equipotential plane concave in surface, the outer side thereof need be at a negative potential higher in value than then the center thereof, so that respective output voltages of the reflection voltage supply sources 1311 to 1113 are set such that the further outward the position of the electrode is advanced, as in the case of the intermediate electrode 1304, and the outside electrode 1305, the higher than a voltage impressed to the center electrode 1303 is a voltage impressed thereto. By so doing, the equipotential plane 1302' can be rendered identical in shape to the equipotential plane 1302 shown in FIG. 13A. Further, while a correction amount of aberration is dependent on curvature of the concave surface, and a single potential in the case of one sheet of the electrode 1301 having a physically concave shape, described as above, effective curvature of the concave surface can be optionally set by the plural electrodes 1303 to 1305, obtained by dividing the electrode in the shape of the concentric circles in the case of the electrostatic mirror according to the present invention, so that it is possible to control a correction amount of aberration. Furthermore, if the electrodes in the shape of the concentric circles, shown in FIGS. 13B, 13C, respectively, are formed by masking, and exposure, this will enable electrodes high in coaxiality to be formed with ease, so that the electrostatic mirror can be adjusted with ease.

Now, there is described hereinafter a configuration of a charged particle beam apparatus using the electrostatic mirror according the present invention. With the second to fifth embodiments thus far described, aberration correction enabling correction of the off-axial aberration has been described, but with the present embodiment, there will be described an apparatus capable of correcting the axial aberrations different from the off-axial aberration, namely, spherical aberration, and axial chromatic aberration. In this case, description is given by taking an example of the multi-beam type electron beam inspection apparatus shown in FIG. 2. An electron beam inspection apparatus using the electrostatic mirror according the present invention can be applied not only to the multi-beam type electron beam inspection apparatus shown in FIG. 2 but also to a common electron beam inspection apparatus with the use of a single primary electron beam without dividing the primary electron beam into plural the electron beams. Points of difference in configuration from FIG. 2 are described hereinafter.

In FIG. 2, the multi-beams forming unit 102 is disposed, however, with this electrostatic mirror, the multi-beams forming unit 102 is unnecessary, and a primary electron beam falls on the beam separator 211 without being divided into plural electron beams. In this case, it need only be sufficient to install a convergent lens for converging the primary electron beam in place of the multi-beams forming unit 102. Further, in this case, the primary electron beam outgoing from the beam separator 211 is the primary electron beam effectively not containing an off-axial trajectory, so that there is no need for the aberration corrector 212. For the electrostatic mirror 213, use is made of the electrostatic mirror of the configuration described as above. The center electrode 1303, the intermediate electrode 1304, and the outside electrode 1305 are connected to the optical system controller 239, and the respective electrodes are controlled by the optical system controller 239. Since the electrostatic mirror of the configuration described as above has a function of correcting the axial aberrations, that is, the spherical aberration, and the axial chromatic aberration, if the primary electron beam is reflected by the electrostatic mirror, this will enable correction of the spherical aberration, and the axial chromatic aberration. The primary electron beam after reflection falls on the beam separator 211 again to be applied to the wafer. Further, a configuration whereby the primary electron beam passes through the beam separator 211 twice has been described early on, however, there is no limitation to such an embodiment, and use may be made of two units of beam separators such that the primary electron beam falls on each of the beam separators once, or a configuration may be adopted whereby use is made of one unit of beam separator, and the primary electron beam passes through the beam separator only once before the primary electron beam falls on the electrostatic mirror, or before reflection by the electrostatic mirror. That is, since the beam separator is for use to enable the primary electron beam from the electron source to reach the wafer via the electrostatic mirror, wherever the beam separator may be disposed as long as the primary electron beam follows such a path. Further, as for the secondary electron detectors 223a to 223c of the secondary electron detection system 240, if at least one unit of the secondary electron detector is present, this will be sufficient although a plurality thereof may be present.

With the present embodiment, there is described an example wherein the present invention is applied to the common electron beam inspection apparatus with the use of a single primary electron beam, however, if the electrostatic mirror according to the present embodiment is applied to the electrostatic mirror according to any of the first to fifth embodiments (the electrostatic mirror 213, any of the electrostatic mirrors 602a, 602b, or both thereof), it is possible to correct the axial aberrations, that is, the spherical aberration, and the axial chromatic aberration.

With the present embodiment, the number of the electrodes in the shape of concentric circles is assumed to be three, however, even if the number of the electrodes varies, this will not eliminate the effects of the invention. More specifically, not less than two units of the electrodes is sufficient. Further, since FIG. 13B shows a configuration of a part of the electrostatic mirror, mainly contributing to reflection of the primary electron beam, if the electrode mainly contributing to reflection of the primary electron beam has the configuration shown in FIG. 13B, the electrostatic mirror may have a configuration not shown in FIG. 13B.

With a number of the embodiments so far described in detail, there have been shown the case of inspection using an electron beam, however, the effects of the invention can be ensured even in the case of using an ion beam and in the case of a common electron microscope such as a measuring instrument, a lithography apparatus, and so forth. Furthermore, with those embodiments referred to in the foregoing, the wafer is taken as an example of the specimen that is an observation target, however, the effects of the invention are ensured even in the case where the observation target is a portion of the wafer, a magnetic disc, or a structure other than semiconductor, such as a biological specimen, and so forth.

What is claimed is:
1. A charged particle beam apparatus comprising:
    a charged particle source;
    a stage for supporting a specimen;
    a beam separator;
    an electrostatic mirror disposed in a path of charged particles emitted from the charged particle source, between the charged particle source and the stage; and
    an aberration corrector disposed between the beam separator and the electrostatic mirror, in a section of the path of the charged particles between the charged particle source and the electrostatic mirror, and a section of the path of the charged particles between the electrostatic mirror and the stage, for use in common with both of those sections of the path;
    wherein a field where the aberration corrector is formed is made up of magnetic quadrupole fields in combination with electrostatic octupole fields for correction of off-axial aberration, and
    wherein the magnetic quadrupole fields are symmetric with respect to a symmetry plane and the electrostatic octupole fields are antisymmetric with respect to the symmetry plane.

2. The charged particle beam apparatus according to claim 1,
wherein the beam separator is disposed in a section of the path of the charged particles between the charged particle source and the aberration corrector, and a section of the path of the charged particles between the aberration corrector and the stage, for use in common with both of those sections of the path.

3. The charged particle beam apparatus according to claim 1, wherein the aberration corrector includes an electron lens.

4. The charged particle beam apparatus according to claim 1, further comprising:
a multi-beams forming unit for turning the charged particles into a plurality of charged particle beams, disposed between the charged particle source, and the aberration corrector, and
a detector for detecting secondary charged particles generated from the specimen due to application of the plurality of charged particle beams to the specimen.

5. The charged particle beam apparatus according to claim 1, wherein the electrostatic mirror is comprised of a plurality of electrodes divided in a circumferential direction of the electrostatic mirror.

6. The charged particle beam apparatus according to claim 1, wherein the electrostatic mirror is comprised of a plurality of electrodes divided in the shape of concentric circles.

7. The charged particle beam apparatus according to claim 1, wherein the charged particles pass through the aberration corrector twice due to respective tracks of the charged particles, being reflected by the electrostatic mirror.

8. The charged particle beam apparatus according to claim 1, wherein the aberration corrector includes a twelve pole, for correction of off-axial aberration.

9. A charged particle beam apparatus comprising:
a charged particle source;
a stage for supporting a specimen;
an electrostatic mirror disposed in a path of charged particles emitted from the charged particle source, between the charged particle source and the stage;
an aberration corrector disposed in a section of the path of the charged particles between the charged particle source and the electrostatic mirror, and a section of the path of the charged particles between the electrostatic mirror and the stage, for use in common with both of those sections of the path;
a second electrostatic mirror disposed in a section of the path of the charged particles between the aberration corrector and the stage, and
a second aberration corrector disposed in a section of the path of the charged particles between the aberration corrector, and the second electrostatic mirror, and a section of the path of the charged particles, between the second electrostatic mirror and the stage, for use in common with both of those sections of the path.

10. The charged particle beam apparatus according to claim 9, further comprising:
a beam separator disposed in a section of the path of the charged particles between the charged particle source and the aberration corrector, a section of the path of the charged particles between the aberration corrector and the second aberration corrector, and a section of the path of the charged particles between the second aberration corrector and the stage, for use in common with those three sections of the path.

* * * * *